United States Patent
Yanagiuchi

[11] Patent Number: 5,945,856
[45] Date of Patent: Aug. 31, 1999

[54] DIGITAL PHASE LOCKED CIRCUIT WITH SHORTENED LOCK TIME

[75] Inventor: Hiroshi Yanagiuchi, Tokyo, Japan

[73] Assignee: Sony Corporation, Tokyo, Japan

[21] Appl. No.: 08/881,279

[22] Filed: Jun. 24, 1997

[30] Foreign Application Priority Data

Jul. 5, 1996 [JP] Japan .................................. 8-176887

[51] Int. Cl.[6] .................................................. H03K 5/13
[52] U.S. Cl. ........................... 327/159; 327/158; 327/160
[58] Field of Search ..................................... 327/158, 151, 327/150, 160, 159

[56] References Cited

U.S. PATENT DOCUMENTS

| | | | |
|---|---|---|---|
| 5,087,829 | 2/1992 | Ishibashi | 327/151 |
| 5,173,617 | 12/1992 | Alsup | 327/158 |
| 5,493,243 | 2/1996 | Ghoshal | 327/158 |
| 5,506,868 | 4/1996 | Chiang | 327/151 |
| 5,548,235 | 8/1996 | Marbot | 327/158 |
| 5,757,868 | 5/1998 | Kelton | 327/151 |

*Primary Examiner*—Kenneth B. Wells
*Assistant Examiner*—Hai L. Nguyen
*Attorney, Agent, or Firm*—Ronald P. Kananen; Rader, Fishman & Grauer

[57] ABSTRACT

A clock control circuit 10 generates a reference clock signal $CK_2$ in accordance with a clock signal CLK, performs a phase comparison with an oscillation signal S50 from a programmable mask generation circuit 50 at a phase comparator 20, generates an up signal $S_{up}$ or a down signal $S_{dw}$ in accordance with the result of comparison, and outputs the same to a counter 30. The counter 30 sequentially determines values of the bits from the most significant bit to the least significant bit, outputs the count S30 to a digital control delay line 40, and controls the frequency of an oscillation signal S40. After reaching the locked state, the counter 30 sequentially determines the values of bits from the least significant bit to the most significant bit in accordance with the up/down signal and tracks the reference clock signal $CK_2$, therefore the lock up time of the digital PLL circuit can be shortened.

23 Claims, 22 Drawing Sheets

FIG. 11A CLK 
FIG. 11B RST 
FIG. 11C $CK_0$ 
FIG. 11D $CK_1$ 
FIG. 11E $CK_2$ 
FIG. 11F Sup 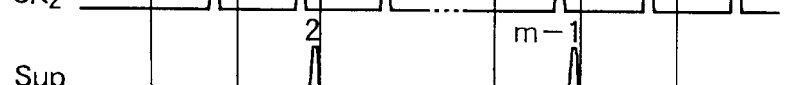
FIG. 11G Sdw 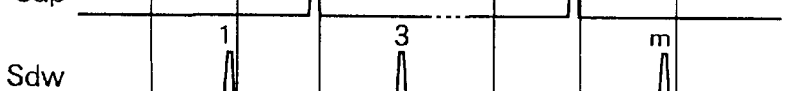
FIG. 11H Send 
FIG. 11I $So_{m-1}$ 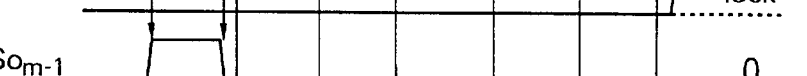
FIG. 11J $So_{m-2}$ 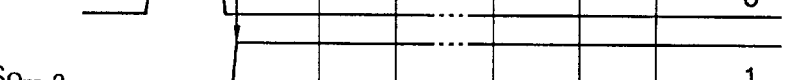
FIG. 11K $So_{m-3}$ 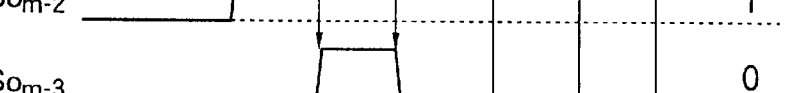
FIG. 11L $So_1$ 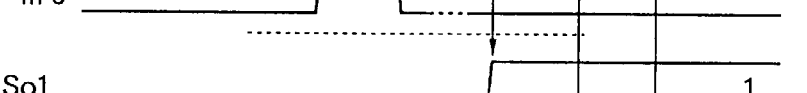
FIG. 11M $So_0$ 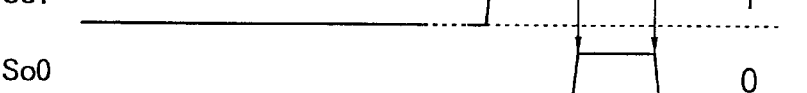

FIG.24A CLK

FIG.24B RST

FIG.24C setbit

FIG.24G Sup

FIG.24H Sdw

FIG.24I Send — lock up

FIG.24J Som-1 — 0

FIG.24K Som-2 — 1

FIG.24L Som-3 — 0

DIGITAL PHASE LOCKED CIRCUIT WITH SHORTENED LOCK TIME

BACKGROUND OF THE INVENTION

1. Field of the Invention

The present invention relates to a digital phase locked loop (PLL) circuit.

2. Description of the Related Art

A usual digital PLL circuit is for example comprised of a phase comparator, a digital counter, a frequency multiplier, and a frequency divider. It compares the phase of a reference clock and a return loop by the phase comparator, sets the data of the digital counter so as to minimize the phase error, and decides on the multiplying factor of the frequency multiplier or the dividing factor of the frequency divider based on that set data. To reduce the jitter, however, the number of bits of the digital counter must be increased. If the number of bits is increased, however, it takes time to minimize the phase error. That is, there is an inverse relationship between the reduction of the jitter and the reduction of the time taken for phase locking.

SUMMARY OF THE INVENTION

An object of the present invention is to provide a digital PLL circuit achieving both the reduction of the jitter and the reduction of the time taken for phase locking.

According to a first aspect of the present invention, there is provided a digital PLL circuit having a clock generation circuit for generating first, second, and third clock signals based on a reference clock signal; a phase comparison circuit for comparing phases of the third clock signal and a signal to be compared; a digital counter for sequentially determining a count from a most significant bit to a least significant bit based on the result of comparison of the phase comparison circuit for every input of the first clock signal; and a frequency multiplying circuit which gives a delay in accordance with the count from the digital counter with respect to the second clock signal, multiplies the frequency of the second clock signal by a predetermined frequency factor, and outputs the frequency multiplied signal to the phase comparison circuit as the signal to be compared.

According to a second aspect of the present invention, there is provided a digital PLL circuit having a second frequency dividing circuit for dividing the frequency of the reference clock signal by M (M is any integer); a first selection circuit which selects one of the reference clock signal and frequency-divided clock signal and outputs the same; a phase comparison circuit which compares the phases of the output signal of the first selection circuit and the signal to be compared; a digital counter which sequentially determines the count from a most significant bit to a least significant bit based on the result of comparison of the phase comparison circuit; a frequency multiplying circuit which outputs the frequency multiplied signal obtained by frequency multiplication with the predetermined frequency factor in accordance with the count from the digital counter; a third frequency dividing circuit which divides the frequency of the frequency multiplied signal from the frequency multiplying circuit by N (N is any integer) and outputs the frequency-divided signal as the signal to be compared to the phase comparison circuit.

That is, according to the present invention, first, second, and third clock signals are generated based on a reference clock signal, and phases of the third clock signal and the signal to be compared are compared by a phase comparison circuit. Then, a count of a digital counter is sequentially determined from the most significant bit to the least significant bit in accordance with the result of comparison. A frequency of the second clock signal is multiplied with a predetermined frequency factor based on the count, and the frequency multiplied signal is output to the phase comparison circuit as the signal to be compared.

When it is decided that a digital PLL circuit reached a locked state, the count operation is switched in the digital counter, and the count is sequentially determined from the least significant bit to the most significant bit based on the result of phase comparison from the phase comparison circuit.

By such a digital PLL circuit, the time required until the locked state is reached can be greatly shortened. Further, by making the number of bits of the digital counter large, mutually contradictory objectives such as the shortening of time until the locked state is reached and an improvement of a phase tracking precision can be simultaneously achieved.

BRIEF DESCRIPTION OF THE DRAWINGS

These and other objects and features of the present invention will become clearer from the following description of the preferred embodiments given with reference to the accompanying drawings, in which:

FIGS. 11A to 11M are waveform diagrams of the operation of the counter 30;

FIGS. 24A to 24N are waveform diagrams of the operation of the fifth embodiment.

DESCRIPTION OF THE PREFERRED EMBODIMENTS

Figure 1:
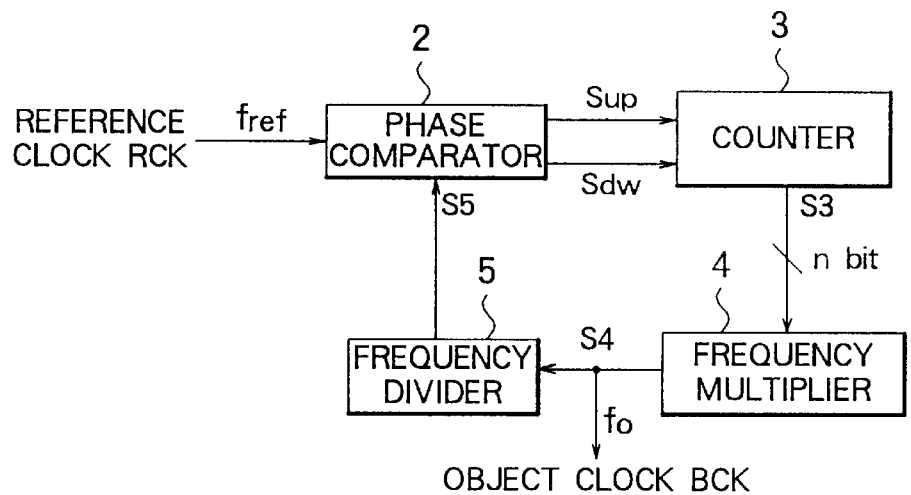
FIG. 1 is a circuit diagram of a first embodiment conventional digital PLL circuit.

FIG. 1 is a circuit diagram of a conventional according to the digital PLL circuit according to the present invention. As illustrated, the digital PLL circuit is constituted by for example a phase comparator 2, a digital counter 3, a frequency multiplier 4, and a frequency divider 5.

The phase comparator 2 compares phases of a reference clock signal RCK of the frequency $f_{ref}$ and an oscillation output S5 from the frequency divider 5 and outputs an up/down signal Sup/Sdw in accordance with the result of comparison to the digital counter 3. For example, where the cycle of the oscillation output S5 is low with respect to the reference clock signal, an up signal is output to the digital counter 3, while in the reverse case a down signal is output to the digital counter 3.

The digital counter 3 counts up or down from the least significant bit to the most significant bit based on the up/down signal Sup/Sdw from the phase comparator 2, and outputs an n-bit count S3 to the frequency multiplier 4.

The frequency multiplier 4 has a function similar to that of a voltage control oscillator (VCO), determines the oscillation frequency by an input count S3, and finally outputs a target clock S4 of the frequency $f_0$.

The frequency divider 5 outputs the oscillation output f5 obtained by dividing the frequency of the output signal S4 from the frequency multiplier 4 to the phase comparator 2.

Figure 2:
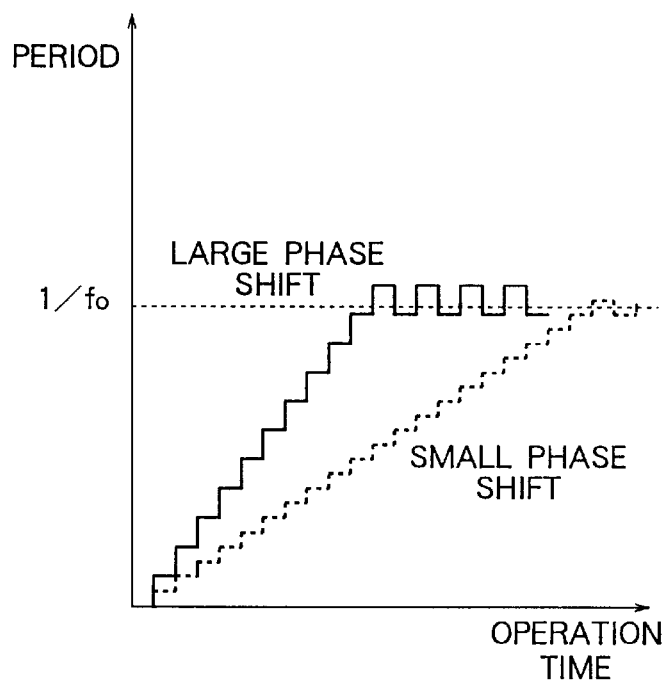
FIG. 2 is a view of a frequency output operation of the digital PLL circuit.

In the digital PLL circuit shown in FIG. 1, as shown in FIG. 2, where the digital counter 3 is an n-bit counter, an operation time of $2^n/f_{ref}$ at the maximum is required until the locked state is reached.

Figure 3:
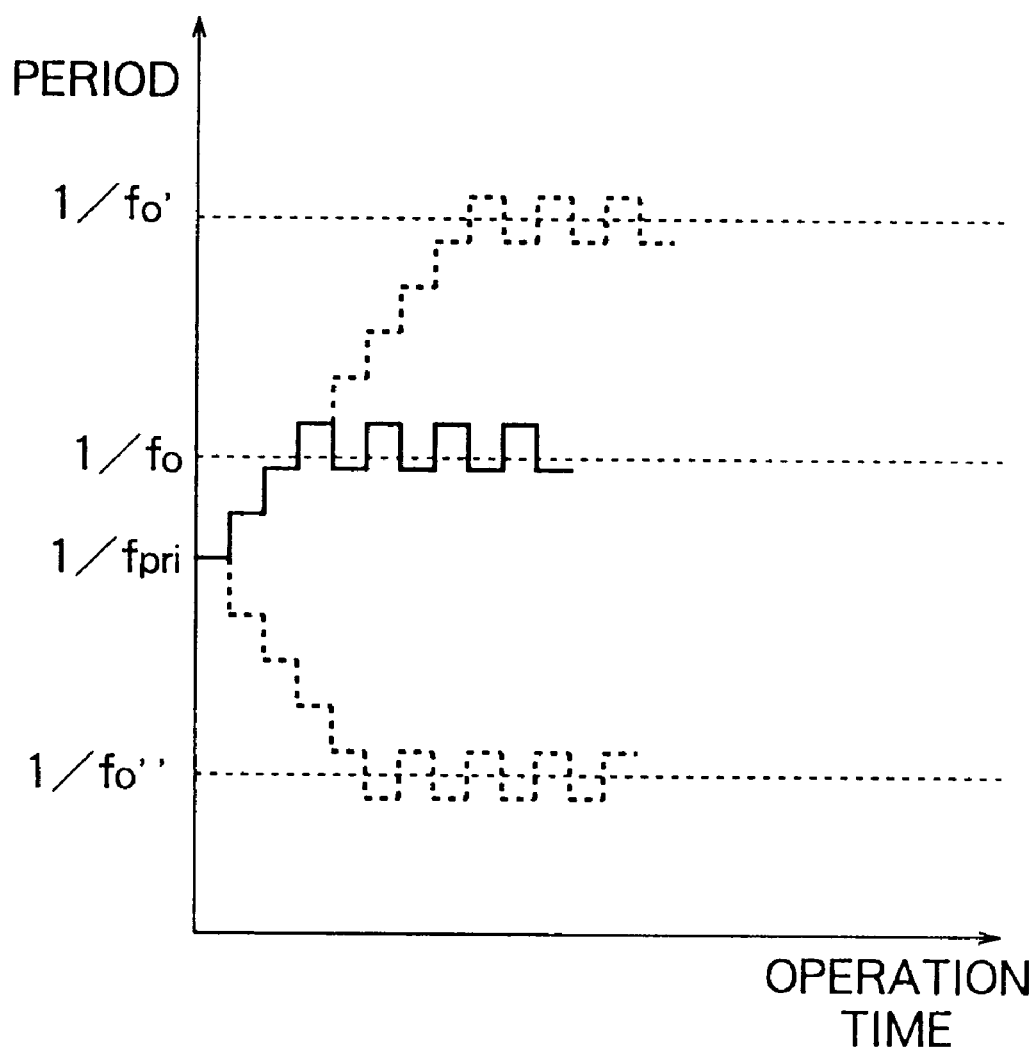
FIG. 3 is a view of a frequency output operation of the digital PLL circuit.

Further, as shown in FIG. 3, there also exists a procedure for shortening the required time until the locked state is reached by presetting the initial value of the count at the frequency $f_{pri}$ in the vicinity of the target frequency $f_0$, but in this procedure, where the target frequency $f_0$ changes to for example $f_0'$ or $f_0''$, the effect thereof cannot be adequately exhibited.

Accordingly, in the digital PLL circuit shown in FIG. 1, in order to shorten the time until the locked state is reached, it is necessary to decrease the number of bits of the digital counter 3.

On the other hand, in the digital PLL circuit shown in FIG. 1, when controlling the frequency multiplier 4 by the count S3 of the digital counter 3, for example, the weighting of the amount of phase shift of the frequency is carried out with respect to each bit of the count S3, but if the amount of phase shift is large, the jitter becomes big, therefore in order to satisfy a required precision by the output frequency of the digital PLL circuit, it is necessary to increase the number of bits of the digital counter 3 and reduce the amount of phase shift as much as possible.

First Embodiment

Figure 4:
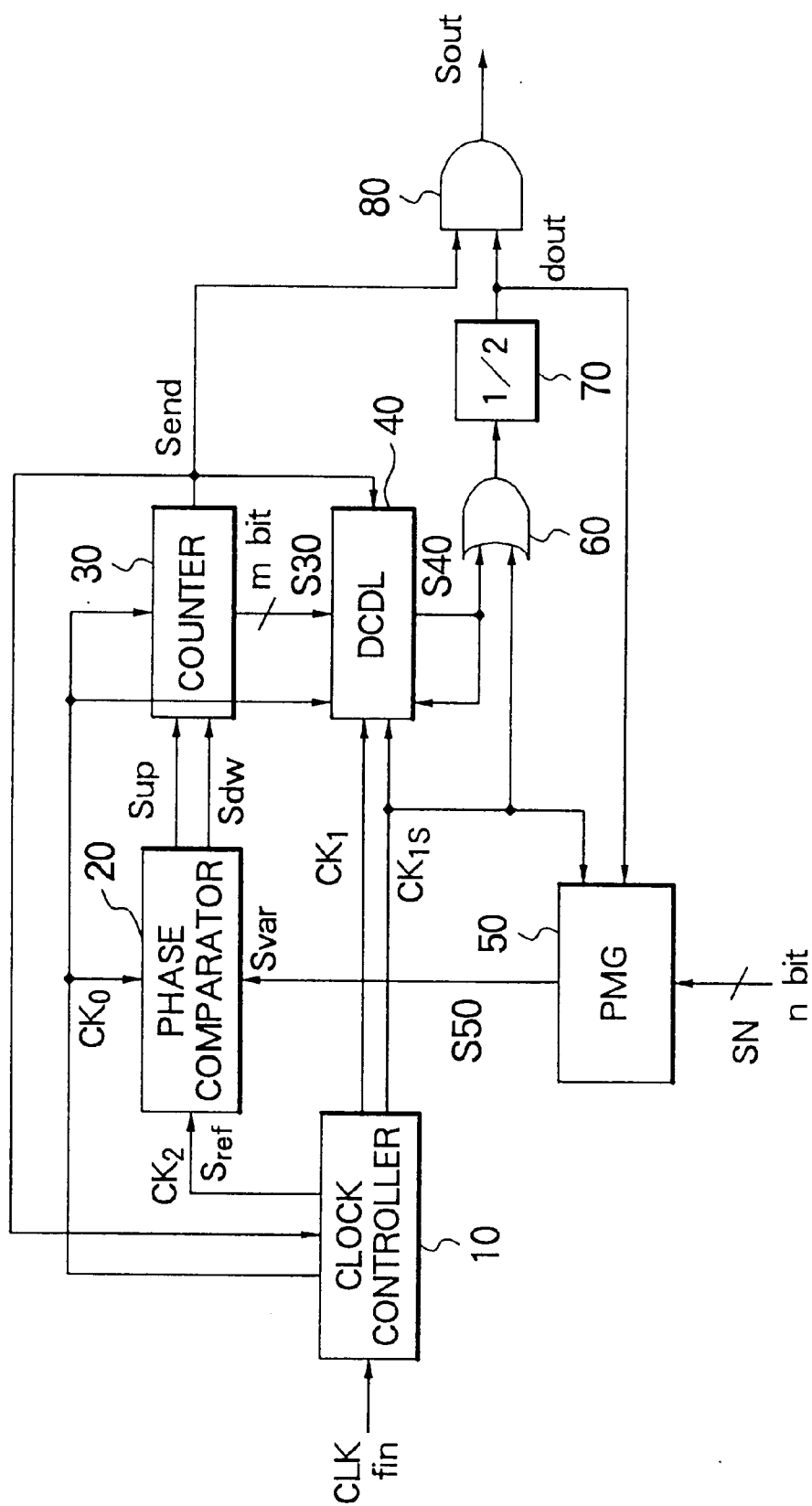
FIG. 4 is a circuit diagram of a first embodiment of the digital PLL circuit according to the present invention.

FIG. 4 is a circuit diagram of a first embodiment of the digital PLL circuit according to the present invention.

As illustrated, the digital PLL circuit of the present example is constituted by a clock control circuit 10, a phase comparator 20, a counter 30, a digital control delay line (DCDL) 40, a programmable mask generation circuit (PMG) 50, an OR gate 60, a frequency divider 70, and an AND gate 80.

The clock control circuit 10 receives an external clock signal CLK of frequency $f_{in}$ and generates clock signals $CK_0$, $CK_1$, $CK_{1S}$, and $CK_2$. The clock signal $CK_0$ is output as the reset signal to the phase comparator 20, the counter 30, and the digital control delay line 40. The clock signal $CK_2$ is supplied as the reference clock signal to the phase comparator 20. Further, the clock signals $CK_1$ and $CK_{1S}$ are input to the digital control delay line 40 to control the delay operation. Further, the clock signal $CK_{1S}$ is output to the programmable mask generation circuit 50 to control the operation thereof.

The clock control circuit 10 receives a lock signal $S_{end}$ from the counter 30 and controls the generation of the clock signal $CK_{1S}$ in accordance with this.

The phase comparator 20 compares the phases of the reference clock signal $CK_2$ from the clock control circuit 10 and the oscillation signal S50 from the programmable mask generation circuit 50, generates the up signal $S_{up}$ or the down signal $S_{dw}$ in accordance with the result of comparison, and outputs the same to the counter 30.

The counter 30 performs the count up or count down operation upon receipt of the up signal $S_{up}$ or the down signal $S_{dw}$ from the phase comparator 20, sets up the m-bit count S30, and outputs the same to the digital control delay line 40.

Note that, in the present embodiment, until the digital PLL circuit reaches the locked state, the counter 30 sequentially determines the count from the most significant bit to the least significant bit based on the up signal $S_{up}$ and the down signal $S_{dw}$ from the phase comparator 20. After the locked state is reached, it switches the count operation and sequentially determines the count from the least significant bit to the most significant bit based on the up signal $S_{up}$ and the down signal $S_{dw}$.

The digital control delay line 40 receives the clock signals $CK_0$, $CK_1$, and $CK_{1S}$ from the clock control circuit 10 and further receives the m-bit count S30 and the lock signal $S_{end}$ from the counter 30, generates the oscillation signal S40, and outputs the same to the OR gate 60.

The OR gate 60 receives the oscillation signal S40 from the digital control delay line 40 and the clock signal $CK_{1S}$ from the clock control circuit 10, generates a logical OR of these signals, and outputs the same as the oscillation signal S60 to the frequency divider 70.

The frequency divider 70 divides the frequency of the oscillation signal S60 from the OR gate 60 by two, generates a frequency-divided signal $d_{out}$, and outputs the same to the AND gate 80.

The AND gate 80 receives the lock signal $S_{end}$ from the counter 30 and the frequency-divided signal $d_{out}$ from the frequency divider 70, generates a logical AND of these signals, and outputs the same as the output signal $S_{out}$ of the digital PLL circuit.

Further, the programmable mask generation circuit 50 receives the clock signal $CK_{1S}$ from the clock control circuit 10 and the frequency-divided signal $d_{out}$ from the frequency divider 70 and further generates an oscillation signal S50 in response to the n-bit control signal SN input from the external unit and outputs this as the signal to be compared to the phase comparator 20.

Below, a detailed explanation will be made of parts of the clock control circuit 10, phase comparator 20, counter 30, digital control delay line 40, and programmable mask generation circuit 50 constituting the digital PLL circuit of the present invention by referring to circuit diagrams and waveform diagrams.

Figure 5:
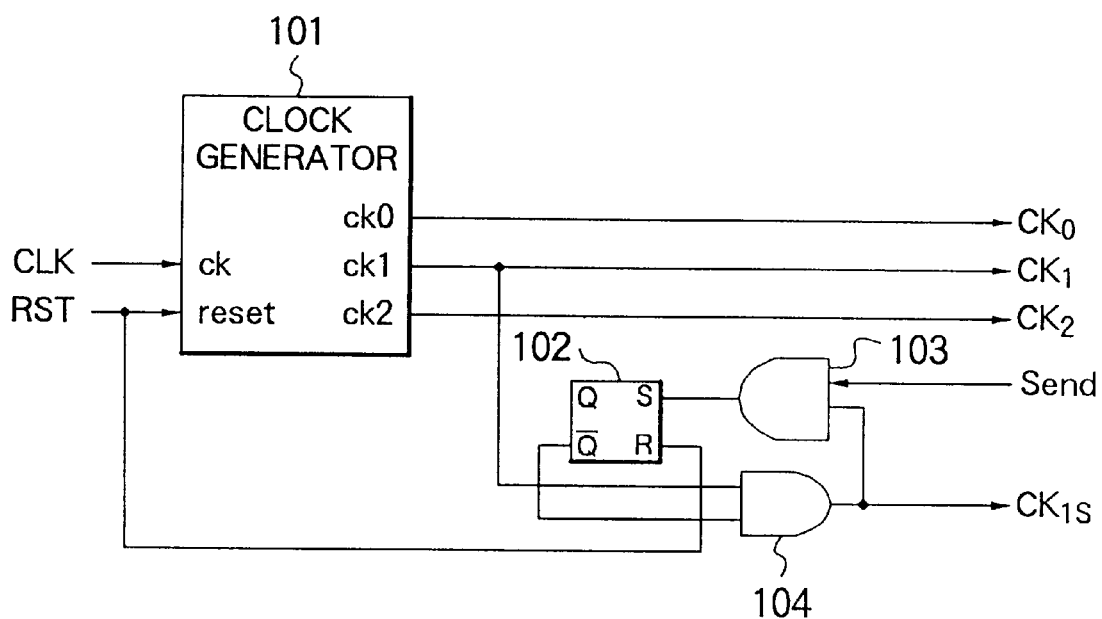
FIG. 5 is a circuit diagram of the configuration of a clock control circuit 10.

FIG. 5 is a circuit diagram of the configuration of the clock control circuit 10.

As illustrated, the clock control circuit 10 is constituted by a clock generation circuit 101, an RS flip-flop 102, and AND gates 103 and 104.

The clock generation circuit 101 receives a clock signal CLK input from the external unit and generates as the reference clock the clock signal $CK_2$ and the clock signals $CK_0$ and $CK_1$.

A set signal input terminal S of the RS flip-flop 102 is connected to an output terminal of the AND gate 103, and a reset signal input terminal R is connected to the input terminal of the reset signal RST. An inverted signal output terminal of the RS flip-flop 102 is connected to one input terminal of the AND gate 104, and the other input terminal of the AND gate 104 is connected to the output terminal ck1 of the clock signal $CK_1$. The output terminal of the AND gate 104 is connected to the output terminal of the clock signal $CK_{1S}$.

One input terminal of the AND gate 103 is connected to the input terminal of the lock signal $S_{end}$, and the other input terminal is connected to the output terminal of the AND gate 104, that is, the output terminal of the clock signal $CK_{1S}$.

A circuit constituted by the RS flip-flop 102 and the AND gates 103 and 104 receives the lock signal $S_{end}$ generated by the clock generation circuit 101 and the counter 30 shown in FIG. 4 and generates the clock signal $CK_{1S}$, of which only one pulse is output, in synchronization with the clock signal $CK_1$ after the lock signal $S_{end}$ is switched to the high level in synchronization with the clock signal $CK_1$ when the lock signal $S_{end}$ is held at the low level.

Concretely, as shown in FIG. 5, the RS flip-flop 102 is reset by the falling edge of the reset signal RST, and the signal of the high level is output to the inversion output terminal. For this reason, the clock signal $CK_1$ generated by the clock generation circuit 101 is output as the clock signal $CK_{1S}$ via the AND gate 104. At this time, the lock signal $S_{end}$ is held at the low level, therefore the RS flip-flop 102 is not set, and the inversion output terminal is held at the high level as it is.

Further, when the digital PLL circuit shown in FIG. 4 reaches the locked state, the lock signal $S_{end}$ from the counter 30 is switched from the low level to the high level. In response to this, the clock signal $CK_{1S}$ is input to the set signal input terminal S of the RS flip-flop 102 via the AND gate 103, the RS flip-flop 102 is set, and the signal of the low level is output to the inversion output terminal. By this, the clock signal $CK_{1S}$ is held at the low level. Namely, after the lock signal $S_{end}$ from the counter 30 is switched to the low level, the clock signal $CK_{1S}$ is output only one time by the clock control circuit 10. After this, the clock signal $CK_{1S}$ is held at the low level.

Figure 6:
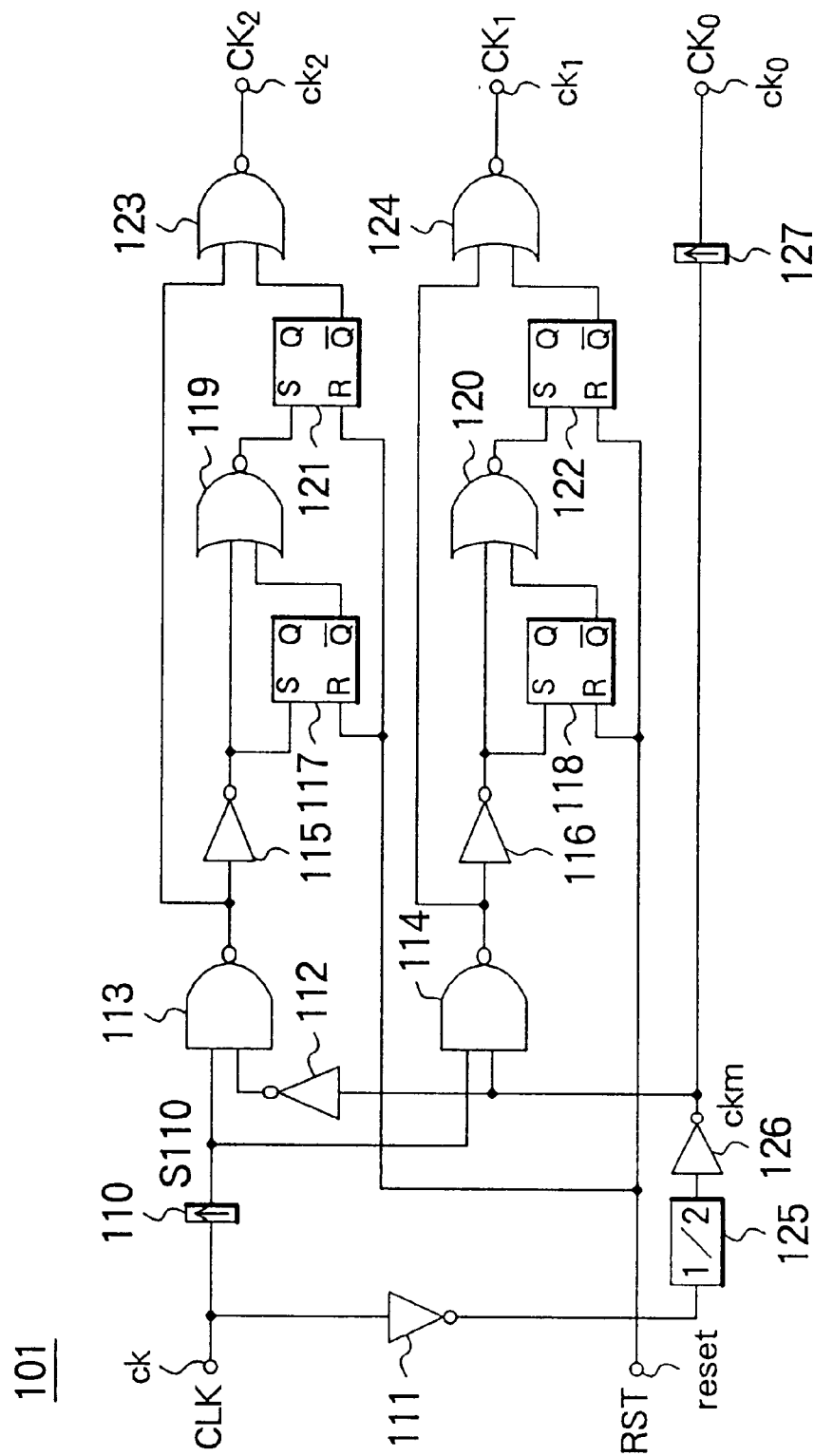
FIG. 6 is a circuit diagram of the configuration of a clock generation circuit 101.

FIG. 6 is a circuit diagram of the configuration of the clock generation circuit 101. As illustrated, the clock generation circuit 101 is constituted by edge detection circuits 110 and 127, inverters 111, 112, 115, 116 and 126, NAND gates 113 and 114, RS flip-flops 117 and 118, NOR gates 119, 120, 123 and 124, and a frequency divider 125.

The edge detection circuit 110 detects the edge of the clock signal input to the clock signal input terminal ck, for example the rising edge, and outputs an edge detection signal S110 indicating this to the NAND gates 113 and 114.

The clock signal input terminal ck is connected to the input terminal of the frequency divider 125 via the inverter 111. The signal obtained by dividing the frequency by two by the frequency divider 125 is inverted via the inverter 126 and output as a clock signal ckm. The clock signal ckm is detected in its edge by the edge detection circuit 127 and output as the clock signal $CK_0$ to the output terminal ck0. Further, the clock signal ckm is input to the NAND gate 114 together with the edge detection signal S110 from the edge detection circuit 110, and the signal obtained by inverting the clock signal ckm by the inverter 112 is input to the NAND gate 113 together with the edge detection signal S110.

The output terminal of the NAND gate 113 is connected to one input terminal of the NOR gate 123, and the output terminal of the NAND gate 113 is connected to one input terminal of the NOR gate 119 via the inverter 115. Further, the output terminal of the inverter 115 is connected to the set signal input terminal S of the RS flip-flop 117, and the reset signal input terminal R of the RS flip-flop 117 is connected to the reset signal input terminal reset.

The inversion output terminal of the RS flip-flop 117 is connected to the other input terminal of the NOR gate 119. Further, the output terminal of the NOR gate 119 is connected to the set signal input terminal S of the RS flip-flop 121, and the reset signal input terminal R of the RS flip-flop 121 is connected to the reset signal input terminal reset.

The inversion output terminal of the RS flip-flop 121 is connected to the other input terminal of the NOR gate 123. The output terminal of the NOR gate 123 is connected to the output terminal ck2 of the clock signal $CK_2$.

The output terminal of the NAND gate 114 is connected to one input terminal of the NOR gate 124, and the output terminal of the NAND gate 114 is connected to one input terminal of the NOR gate 120 via the inverter 116. Further, the output terminal of the inverter 116 is connected to the set signal input terminal S of the RS flip-flop 118, and the reset signal input terminal R of the RS flip-flop 118 is connected to the reset signal input terminal reset.

The inversion output terminal of the RS flip-flop 118 is connected to the other input terminal of the NOR gate 120. Further, the output terminal of the NOR gate 120 is connected to the set signal input terminal S of the RS flip-flop 122, and the reset signal input terminal R of the RS flip-flop 122 is connected to the reset signal input terminal reset.

The inversion output terminal of the RS flip-flop 122 is connected to the other input terminal of the NOR gate 124. The output terminal of the NOR gate 124 is connected to the output terminal ck1 of the clock signal $CK_1$.

FIGS. 7A to 7H are waveform diagrams of the operation of the clock control circuit 10. Below, an explanation will be made of the operation of the clock control circuit 10 by referring to the circuit diagrams of FIG. 8 and FIGS. 9A to 9F and the waveform diagrams of FIGS. 7A to 7H.

The external clock signal CLK of frequency $f_{in}$ is input to the clock signal input terminal ck of the clock generation circuit 101. Further, before the clock control circuit 10 starts operation, a reset signal RST of the high level, for example, the power supply voltage $V_{cc}$ level, is input to the reset signal input terminal reset, and after the start of operation, the reset signal RST is switched from the high level to the low level, for example, the ground potential level.

Figure 7:
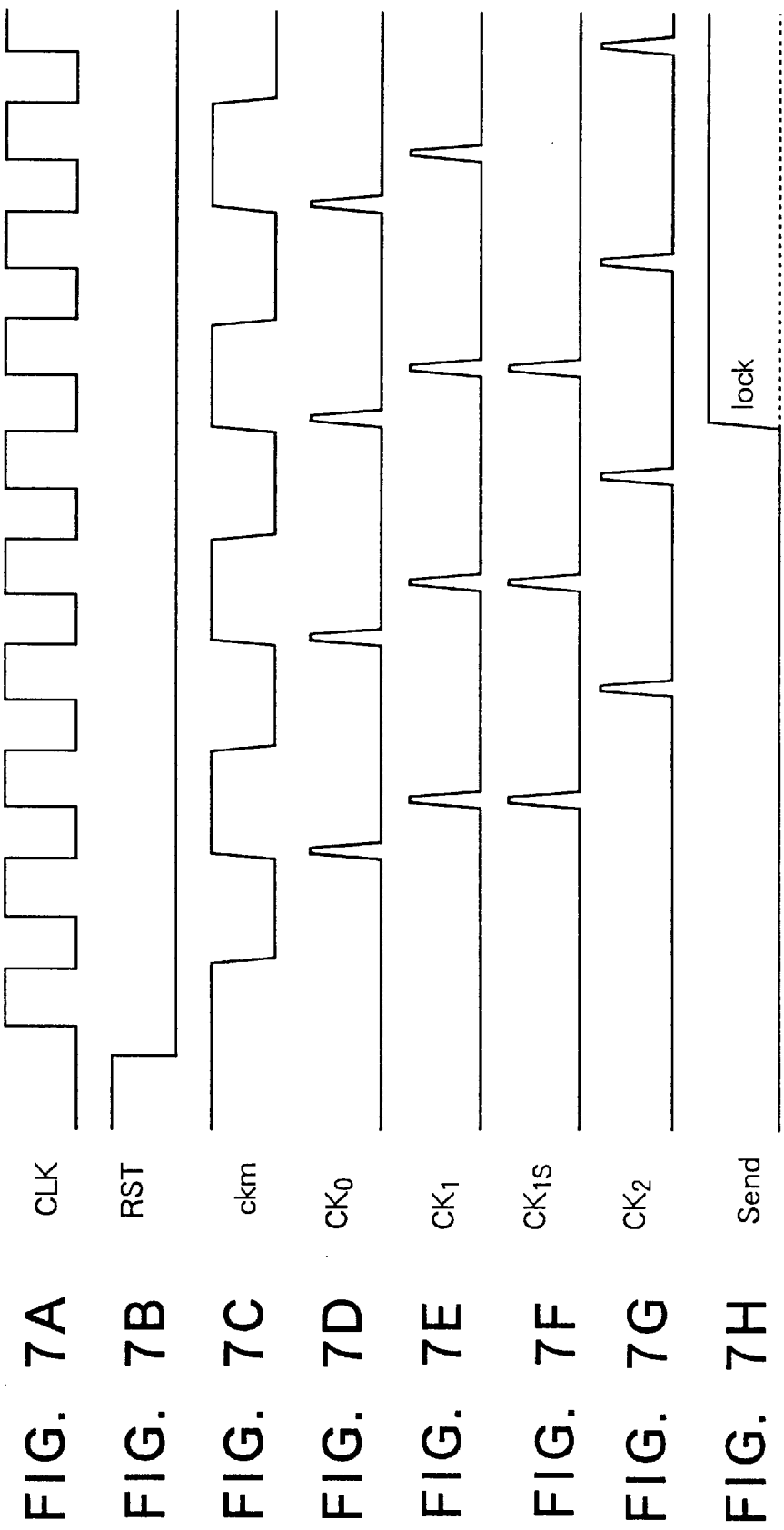
FIGS. 7A to 7H are waveform diagrams of the operation of the clock control circuit 10.

The edge detection circuit 110 detects the rising edge of the clock signal CLK and outputs the edge detection signal S110. Further, the clock signal CLK is inverted by the inverter 111, and the inverted clock signal is divided by two by the frequency divider 125, further inverted by the inverter 126, and output as the clock signal ckm. The clock signal ckm is detected in its rising edge by the edge detection circuit 127, and the clock signal $CK_0$ shown in FIG. 7D is generated and output to the clock signal output terminal ck0.

After the reset signal RST is switched from the high level to the low level, the output signals of the inversion output terminals of the RS flip-flops 117, 118, 121, and 122 are set to the low level. In response to this, the signal of the low level is output to the clock signal output terminals ck1 and ck2.

The inverted signal of the clock signal ckm is input together with the edge detection signal S110 from the edge detection circuit 110 to the NAND gate 113. The clock signal $CK_1$ shown in FIG. 7E is generated in response to this and output to the output terminal ck1.

The clock signal ckm is input together with the edge detection signal S110 from the edge detection circuit 110 to the NAND gate 114. The clock signal $CK_2$ shown in FIG. 7G is generated in response to this and output to the output terminal ck2.

The clock signal $CK_{1S}$ is generated in synchronization with the clock signal $CK_1$ until the digital PLL circuit reaches the locked state. After it reaches the locked state, the clock signal $CK_{1S}$ is output only one time and then held at the low level.

Figure 8:
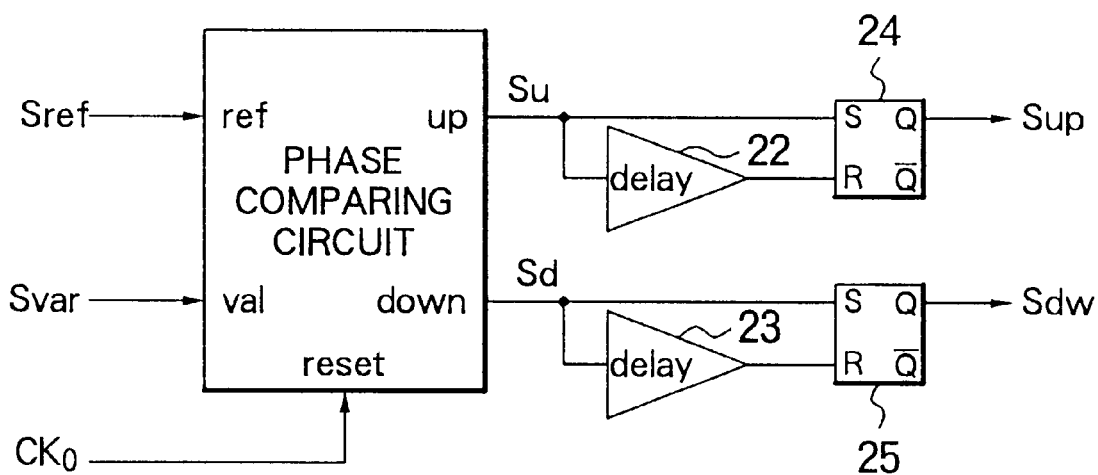
FIG. 8 is a circuit diagram of the configuration of a phase comparator 20.
Figure 9:
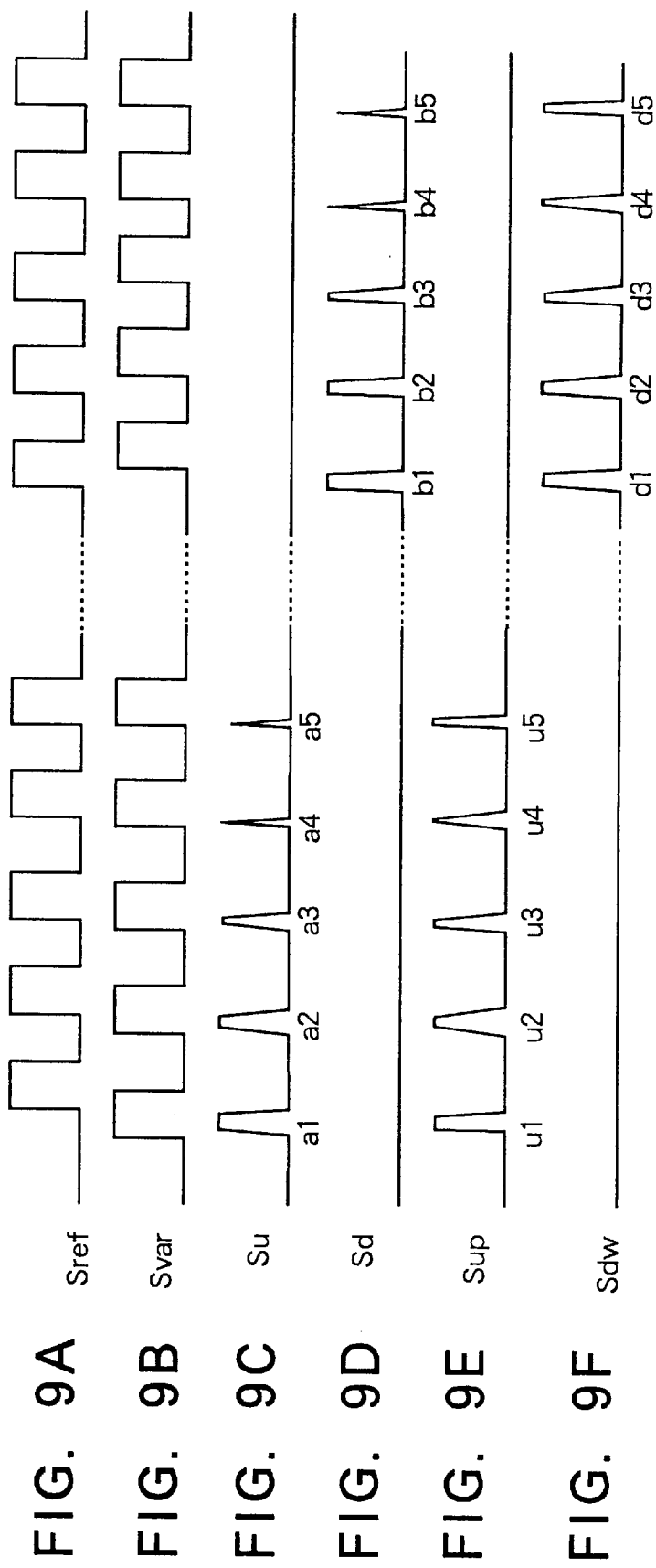
FIGS. 9A to 9F are waveform diagrams of the operation of the phase comparator 20.

FIG. 8 is a view showing the configuration of the phase comparator 20. As illustrated, the phase comparator 20 is constituted by a phase comparison circuit 21, delay circuits 22 and 23, and RS flip-flops 24 and 25.

The clock signal $CK_2$ generated by the clock control circuit 10 is input to the phase comparison circuit 21 as the reference signal $S_{ref}$, and the oscillation signal S50 from the programmable mask generation circuit 50 is input as the comparison target signal $S_{var}$. The up signal $S_u$ and down signal $S_d$ are generated in accordance with the phase difference of the input signals and are respectively output to the output terminals "up" and "down".

The output terminal "up" of the up signal $S_u$ is connected to the set signal input terminal S of the RS flip-flop 24 and further connected to the reset signal input terminal R of the RS flip-flop 24 via the delay circuit 22.

The output terminal "down" of the down signal $S_d$ is connected to the set signal input terminal S of the RS flip-flop 25 and further connected to the reset signal input terminal R of the RS flip-flop 25 via the delay circuit 23.

FIGS. 9A to 9F are waveform diagrams of the operation of the phase comparator 20. As illustrated, where the phase of the reference signal $S_{ref}$ input to the phase comparator 20 is delayed from the phase of the comparison target signal $S_{var}$, the up signal $S_u$ in accordance with the phase difference is output by the phase comparison circuit 21. The pulse width of the up signal $S_u$ is expanded by the circuit constituted by the delay circuit 22 and the RS flip-flop 24 and output as the up signal $S_{up}$.

On the other hand, where the phase of the reference signal $S_{ref}$ is advanced from the phase of the comparison target signal $S_{var}$, a down signal $S_d$ in accordance with the phase difference is output by the phase comparison circuit 21. The pulse width of the down signal $S_d$ is expanded by the circuit constituted by the delay circuit 23 and the RS flip-flop 25 and output as the down signal $S_{dw}$.

By this, when the phase difference of the reference signal $S_{ref}$ and the comparison target signal $S_{var}$ is very small, the pulse width of the up signal $S_u$ or the down signal $S_d$ becomes narrow, the pulse width which is insufficient for driving the counter 30 as it is expanded by the pulse width expansion circuit constituted by the delay circuits 22 and 23 and the RS flip-flops 24 and 25, the driving capability of the up signal $S_{up}$ and the down signal $S_{dw}$ is improved, and a malfunction of the counter 30 is prevented.

Figure 10:
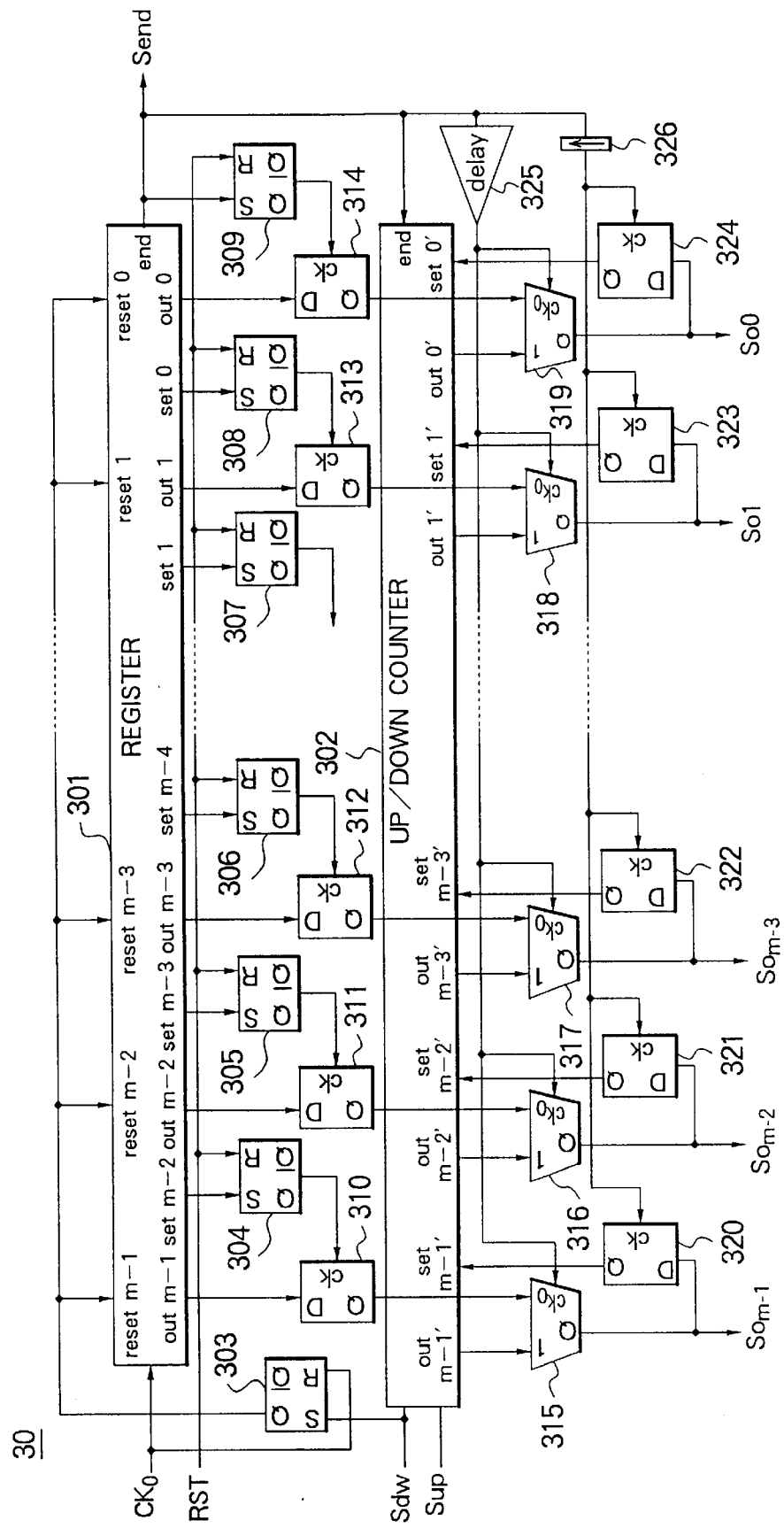
FIG. 10 is a circuit diagram of the configuration of a counter 30.

FIG. 10 is a circuit diagram of the configuration of the counter 30. As illustrated, the counter 30 is constituted by a register 301, a up/down counter 302, RS flip-flops 303, 304, ..., 309, D flip-flops 310, 311, ..., 314, 320, 321, ..., 324, selectors 315, 316, ..., 319, a delay circuit 325, and an edge detection circuit 326.

Reset signal input terminals $r_{m-1}$, $r_{m-2}$, ..., $r_1$, and $r_0$ of the register 301 are connected to the output terminal of the RS flip-flop 303. The set signal input terminal S of the RS flip-flop 303 is connected to the input terminal of the down signal $S_{dw}$, and the reset signal input terminal R is connected to the input terminal of the clock signal $CK_0$.

Output signal terminals $o_{m-1}$, $o_{m-2}$, ..., $o_1$ and $o_0$ of the register 301 are respectively connected to the input terminals of the D flip-flops 310, 311, ..., 313 and 314, and set signal output terminals $s_{m-1}$, $s_{m-2}$, ..., $s_1$ and $s_0$ are respectively connected to the set signal input terminals S of the RS flip-flops 304, 305, ..., 307, and 308. The reset signal input terminals R of the RS flip-flops 304, 305, ..., 307, and 308 are connected to the input terminals of the system reset signal RST.

The clock signal input terminal ck of the register 301 is connected to the input terminal of the clock signal $CK_0$, and the output terminal end of the lock signal $S_{end}$ is connected to the set signal input terminal S of the RS flip-flop 309.

The output terminals $o_{m-1}$, $o_{m-2}$, ... $o_1$, and $o_0$ of the up/down counter 302 are respectively connected to the input terminals 1 of the selectors 315, 316, ..., 318, and 319, and the output terminals of the D flip-flops 310, 311, ..., 313, and 314 are respectively connected to the input terminals 0 of the selectors 315, 316, ..., 318, and 319. The output terminals of the selectors 315, 316, ..., 318, and 319 are respectively connected to the output terminals $O_{m-1}$, $O_{m-2}$, ..., $O_1$, and $O_0$ of the counter 30 and further connected to the input terminals of the D flip-flops 320, 321, ..., 323, and 324. The clock input terminals ck of the selectors 315, 316, ..., 318, and 319 are respectively connected to the output terminal of the delay circuit 327.

The D flip-flops 320, 321, ..., 323, and 324 are connected to the output terminals of the edge detection circuit 326, and the output terminals are respectively connected to the set signal input terminals $s_{m-1}$, $s_{m-2}$, ..., $s_1$, and $s_0$ of the up/down counter 302.

FIGS. 11A to 11M are waveform diagrams of the operation of the counter 30. Below, an explanation will be made of the operation of the counter 30 by referring to the circuit diagram of FIG. 10 and the waveform diagrams of FIGS. 11A to 11M.

The clock signal $CK_0$ generated by the clock control circuit 10 is input to the register 301, and the initial value of the register 301 is set in accordance with the clock signal $CK_0$.

As shown in FIGS. 11A to 11M, all circuits start the operation in the reset state by the system reset signal RST. The lock signal $S_{end}$ indicating whether or not the digital PLL circuit is in the locked state is set to the low level, for example, the ground potential level. For this reason, signals input to the input terminals 0 of the selectors, that is, signals of the output terminals $o_{m-1}$, $o_{m-2}$, ..., $o_1$, and $o_0$ of the register 301 input via the D flip-flops 310, 311, . . . , 313, and 314 are selected by the selectors 315, 316, . . . ,318, and 319 and output to the output terminals $O_{m-3}$, $O_{m-2}$, . . . , $O_1$, and $O_0$ of the counter 30.

As shown in FIGS. 11A to 11M, first, the output terminal $O_{m-1}$ of the most significant bit of the register 301 is set to for example the high level indicating the binary "1" by the pulse 1 of the clock signal $CK_0$ (below, this will be simply referred to as set to "1"). The set value of the output terminal $o_{m-1}$ is input to the input terminal 0 of the selector 315 via the D flip-flop 310. At this time, the lock signal $S_{end}$ of the register 301 is held at the low level, therefore the selection control signal S325 of a low level is output by the delay circuit 325. In response to this, the input signal of input terminal 0 side is selected by the selectors 315, 316, . . . , 318, and 319.

For this reason, the output signal of the most significant bit of the register 301, that is, the signal of the high level indicating the binary "1" is output to the output terminal $O_{m-1}$ of the most significant bit of the counter 30. At this time, "0" is output to all of the other m−1 number of output terminals $O_{m-2}$, . . . , $O_1$, and $O_0$ of the counter 30.

The m-bit output signal S30 is output to the digital control delay line 40 from the counter 30, and the delay time of the digital control delay line 40 is set in accordance with this. Namely, the frequency of the oscillation signal S40 generated by the digital control delay line 40 is set by the output of the counter 30. The frequency of the oscillation signal S40 is divided into two by the frequency divider 70, and further the oscillation signal S50 is selected by the programmable mask generation circuit 50 and input to the phase comparator 20. In the phase comparator 20, phases of the reference clock signal $CK_2$ from the clock control circuit 10 and the oscillation signal S50 from the programmable mask generation circuit 50 are compared, and the up signal $S_{up}$ or the down signal $S_{dw}$ is generated in accordance with the result of comparison and input to the counter 30.

Here, for example, it is assumed that the pulse 1 of the down signal $S_{dw}$ shown in FIG. 11G is output as the result of comparison by the phase comparator 20. The output of the RS flip-flop 303 is set to the high level in accordance with the pulse 1 of the down signal $S_{dw}$ and output to the m−1 bit reset signal input terminal $r_{m-1}$ as the most significant bit of the register 301. In response to this, the most significant bit output ;terminal $o_{m-1}$ of the register 301 is reset to "0".

In the counter 30, the m−2 bit output terminal $o_{m-2}$ of the register 301 is set to "1" by the pulse 2 of the clock signal $CK_0$. The oscillation signal S40 is generated by the digital control delay line 40 in response to this, input to the programmable mask generation circuit 50 via the OR gate 60 and the frequency divider 70, and further selected as the oscillation signal S50 by the programmable mask generation circuit 50 and input to the phase comparator 20. In the phase comparator 20, the phase of this is compared with that of the reference clock signal $CK_2$ generated by the clock control circuit 10, and the up signal $S_{up}$ or the down signal $S_{dw}$ is output in accordance with the result of comparison. In the counter 30, the m−2 bit of the-register 301 is set in accordance with the up signal $S_{up}$ or the down signal $S_{dw}$ from the phase comparator 20.

A similar operation is repeated up to the 0 bit of the register 301, and all of the m-bit signal output by the output terminals $o_{m-1}$, $o_{m-2}$, . . . , $o_1$, and $o_0$ of the register 301 is set. As shown in FIGS. 11A to 11M, finally, the m-bit count "010 . . . 10" is output to the output terminals $O_{m-1}$, $O_{m-2}$, . . . , $O_1$, and $O_0$ by the counter 30.

After all of the m number of bits of the counter 30 are set, that is when the digital PLL circuit becomes the locked state, the lock signal $S_{end}$ is output by the register 301. In response to this, the rising edge of the lock signal $S_{end}$ is detected by the edge detection circuit 326, the edge detection signal is input to the clock input terminals of the D flip-flops 320, 321, . . . , 323, and 324, and the output signals of the output terminals $O_{m-1}$, $O_{m-2}$, . . . , $O_1$, and $O_0$ of the counter 30 are input to the set signal input terminals of the up/down counter 302 via the D flip-flops 320, 321, . . . , 323, and 324, respectively, and preset as the initial value of the up/down counter 302.

Further, after the lock signal $S_{end}$ is delayed by the delay circuit 325, it is input to the clock input terminal ck of the selectors 315, 316, . . . , 318, and 319, and the signal input to the input terminal 1 by the selectors 315, 316, . . . , 318, and 319, that is, the count of the up/down counter 302, is selected in accordance with this and output to the output terminals $O_{m-1}$, $O_{m-2}$, . . . , $O_1$, and $O_0$ of the counter 30.

Note that, the delay time of the delay circuit 325 is a time set larger than the required time until the signal input to the set signal input terminal of the up/down counter 302 is output to the output terminal.

After the initial value of the up/down counter 302 is set, the count operation is carried out in accordance with the up signal $S_{up}$ or the down signal $S_{dw}$ from the phase comparator 20 and the count is set. This count is output to the output terminals $O_{m-1}$, $O_{m-2}$, . . . , $O_1$, and $O_0$ as the output signal of the counter 30.

The up signal $S_{up}$ or the down signal $S_{dw}$ is output in accordance with the change of the frequency or phase of the reference clock signal $CK_2$ input to the phase comparator 20. The count of the up/down counter 302 is set in accordance with this. By this, an oscillation signal S40 tracking the clock signal $CK_2$, that is, tracking the clock signal CLK input to the clock control circuit 10, is generated by the digital control delay line 40.

In this way, by switching the operation of the counter 30 before the locking and after the locking by the digital PLL circuit, the required time until the digital PLL circuit reaches the locked state can be greatly shortened. For example, when assuming that the number of bits of the counter 30 is m, in the conventional type of digital PLL circuit, $2^m$ clocks at the maximum are necessary until the locked state is reached, but in contrast, in the digital PLL circuit of the present invention, 2 (m+1) clocks are sufficient. This is because, if m=10, 2 (10+1) becomes equal to 22 with respect to $2^{10}=1024$, and the time is shortened to about $\frac{1}{47}$. After the digital PLL circuit becomes locked, it is possible to track changes of various operating conditions by the up/down counter 302.

Figure 12:
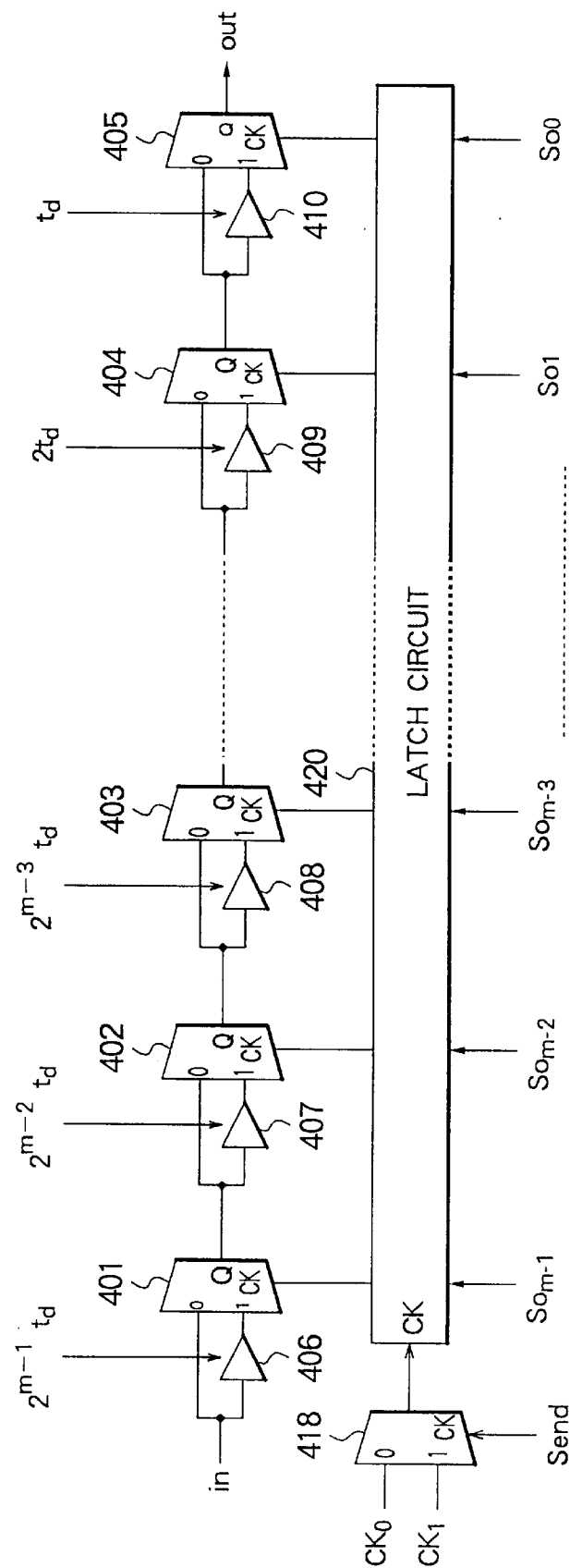
FIG. 12 is a circuit diagram of an example of a digital control delay line 40.

FIG. 12 is a circuit diagram of an example 40a of the digital control delay line 40.

As shown in FIG. 12, the digital control delay line 40a of the present example is constituted by selectors 401, 402, . . . , 404, 405, and 418, buffers 406, 407, . . . , 409, and 410, and an m-bit latch circuit 420.

As illustrated, the digital control delay line 40 is constituted by m number of stages of delay circuits. Each stage of delay circuit is formed by a buffer and a selector.

An input "in" of the digital control delay line 40 is connected to the input terminal 0 of the selector 401 constituting the m−1 stage or connected to the input terminal 1 of the selector 401 via the buffer 406. The selection control signal input terminal ck of the selector 401 is connected to the m−1 bit output terminal of the latch circuit.

Each stage after the digital control delay line 40 is constituted similar to the above m−1 stage. The output terminal of the selector of a former stage is connected to the input terminal 0 of the selector of the latter stage and connected to the input terminal 1 of the selector of the latter stage via the buffer of the latter stage.

Note that, the output terminal of the selector 405 of the 0 stage is connected to the output terminal "out" of the digital control delay line 40.

Further, when assuming that the delay time of the buffer 410 constituting the 0 stage is $t_d$, the delay time of the buffer constituting the i-th stage (0 $ 1<m) is set to $2^i t_d$. For example, the delay time of the buffer 406 is set to $2^{m-1}t_d$, and the delay time of the buffer 407 is set to $2^{m-2}t_d$, respectively.

The input terminals ck of the selection control signal of the selectors 401, 402, . . . , 404, and 405 of each stage are respectively connected to the m number of bits of output terminals of the latch circuit 420. The m number of bits of input terminals of the latch circuit 420 are respectively connected to the m number of bits of the output terminals $O_{m-1}$, $O_{m-2}$, . . . , $O_1$, and $O_0$ of the counter 30.

The clock signal input terminal ck of the latch circuit 420 is connected to the output terminal of the selector 418. The clock signal $CK_0$ is input to the input terminal 0 of the selector 418, and the clock signal $CK_1$ is input to the input terminal 1 of the selector 418. The lock signal $S_{end}$ from the counter 30 is input to the selection control signal input terminal ck of the selector 418.

Before the digital PLL circuit reaches the locked state, the lock signal $S_{end}$ of the low level is output by the counter 30. The selector 418 selects the clock signal $CK_0$ in response to this and supplies the same to the latch circuit 420. After the digital PLL circuit reaches the locked state, the output lock signal $S_{end}$ is switched to the high level by the counter 30. The selector 418 selects the clock signal $CK_1$ in response to this and supplies this to the latch circuit 420.

In such a configuration, the m-bit count S30 from the counter 30 is held by the latch circuit 420 and output to the selectors 401, 402, . . . , 404, and 405.

The selectors 401, 402, . . . , 404, and 405 select the input signal in accordance with the value of each bit of the count S30 and output the same to the next stage. For example, when the m−1 bit of the count S30 has become "1", the signal input to the input terminal 1, that is, the signal delayed via the buffer 406, is selected by the selector 401 and output to the next m−2 stage. In the m−2 stage, for example, when the selection control signal input to the selector 402 becomes "0", the signal input to the input terminal 0 is output to the next stage by the selector 402, that is the output signal of the former stage is output to the next stage as it is not through the buffer 407.

In each stage of the digital control delay line 40, as mentioned above, the state of use of the buffer in each delay stage is determined in accordance with the value of each bit of the count S30 from the latch circuit 420, and the delay time until the signal input from the input terminal "in" is output to the output terminal "out" is set. For this reason, the delay time produced by the digital control delay line 40 is determined in accordance with the count S30 from the counter 30, and the phase or frequency of the oscillation signal generated in accordance with this is set by the count S30.

Figure 13:
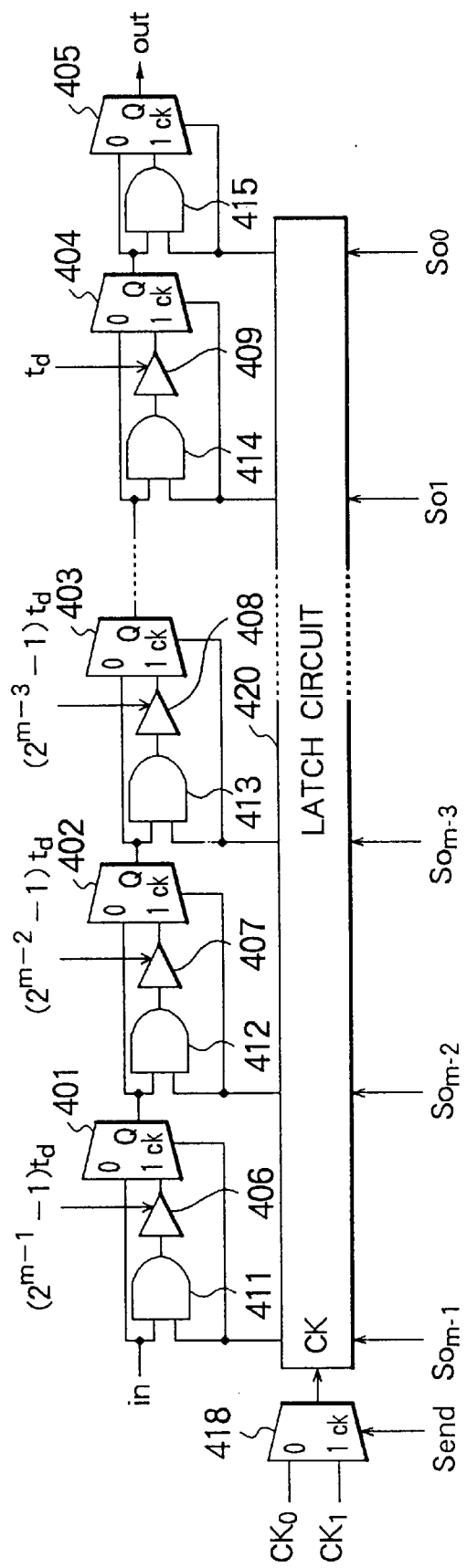
FIG. 13 is a circuit diagram of another example of the digital control delay line 40.

FIG. 13 is a circuit diagram of another example of the digital control delay line 40.

In the digital control delay line 40b of the present example, each stage is constituted by an AND gate, a buffer, and a selector. In the m−1 stage, one input terminal of the AND gate 411 is connected to the output terminal of the latch circuit 420, and the other input terminal is connected to the input terminal "in". The output terminal of the AND gate 411 is connected to the input terminal 1 of the selector 401 via the buffer 406. The input terminal 0 of the selector 401 is connected to the input terminal "in". The selection control signal input terminal ck of the selector 401 is connected to the output terminal of the latch circuit 420.

Each stage m−2, m−3, . . . , 1 of the digital control delay line 40 is constituted similar to the m−1 stage, and the output terminal of the selector of a former stage is connected to the input terminal 0 of the selector of the next stage and further connected to one input terminal of the AND gate of the next stage.

The last stage, that is, the 0 stage, corresponding to the bit $S_{00}$ of the latch circuit 420 is constituted by an AND gate 415 and a selector 405.

Note that, in the digital PLL circuit of the present example, the delay time of the AND gate constituting each stage is set to $t_d$, and the delay time of the buffer constituting the i-th stage is set to $(2-1)t_d$.

In the circuit constituted in this way, when for example the m−1 bit of the latch circuit 420 is set to "1", the input signal of the input terminal 1 is selected at the selector 401 and output to the next m−2 stage. In this case, the signal input to the input terminal "in" is delayed via the AND gate 411 and the buffer 406 and output to the next stage via the selector 401.

Further, when the m−2 bit of the latch circuit 420 is set to "0", the output signal of the AND gate 412 is held at the low level, for example, the ground potential level, the buffer 407 does not operate, and useless power consumption is prevented. At this time, the output signal of the former stage is input to the input terminal 0 of the selector and output to the next stage via the selector.

As mentioned above, in the example of the present circuit, if one stage's worth of delay time of the AND gate and buffer constituting each stage is made equal, unnecessary circuit operation can be prevented. The delay time of the digital control delay line 40 is determined in accordance with the count S30 held by the latch circuit 420, and the phase and frequency of the oscillation signal are controlled in accordance with this.

Figure 14:
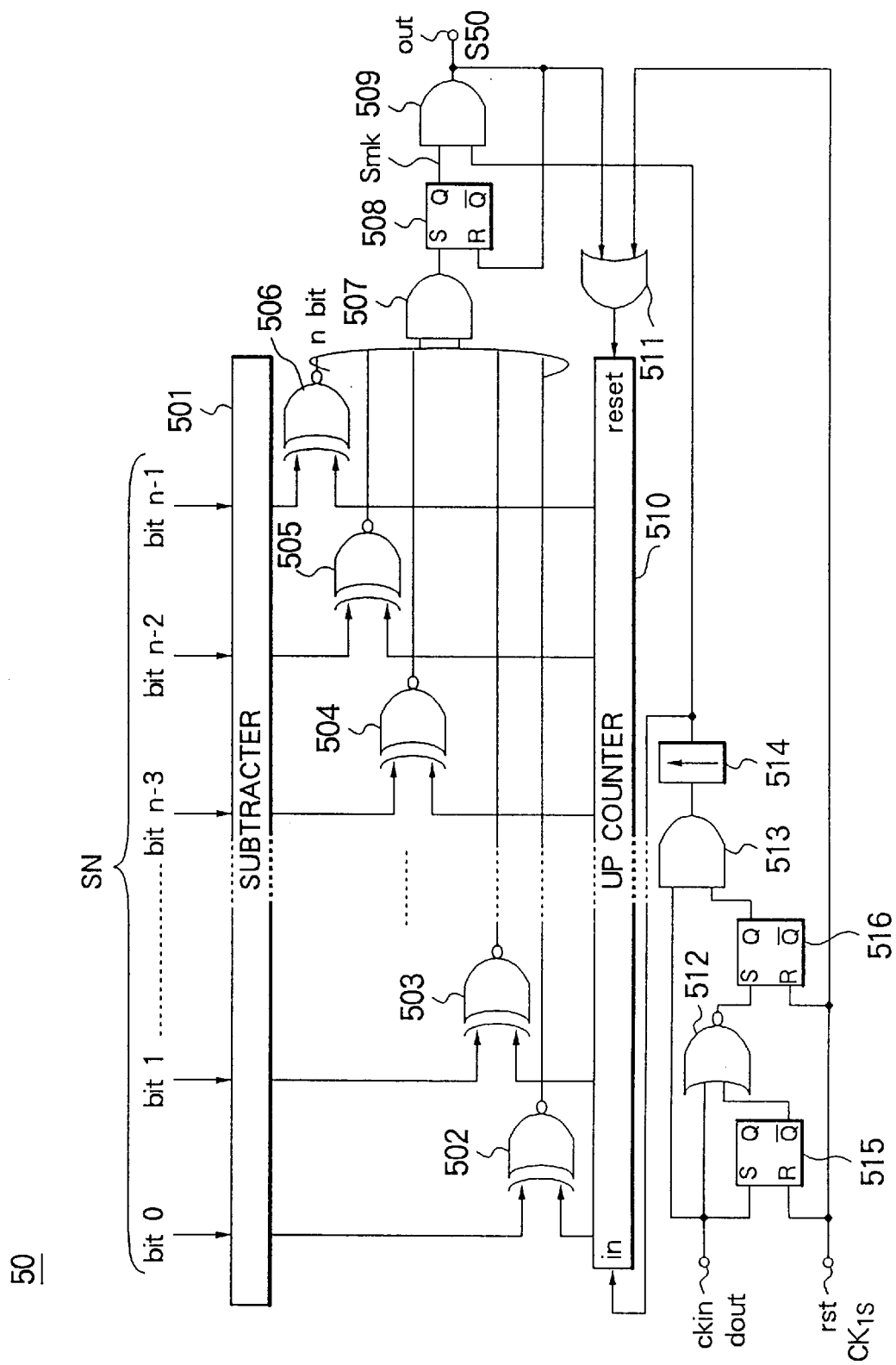
FIG. 14 is a circuit diagram of the configuration of a programmable mask generation circuit 50.
Figure 15:
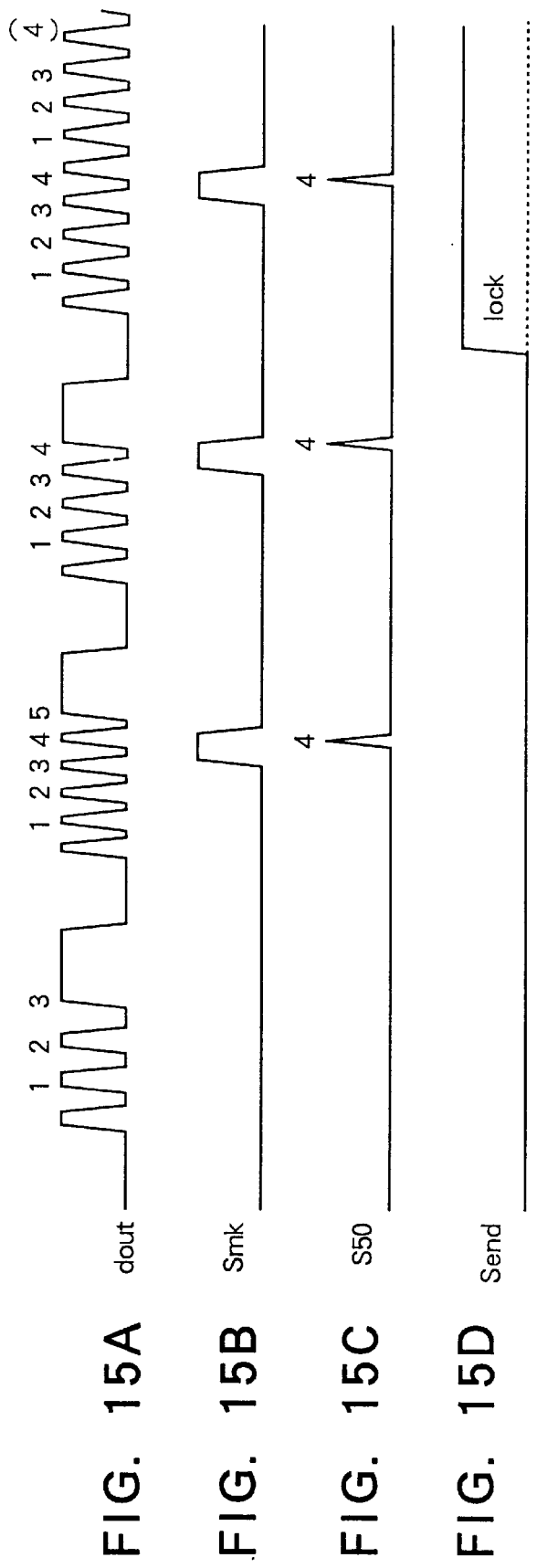
FIGS. 15A to 15D are waveform diagrams of the operation of the programmable mask generation circuit 50.

FIG. 14 is a circuit diagram of the configuration of the programmable mask generation circuit 50.

As illustrated, the programmable mask generation circuit 50 of the present example is constituted by a subtracter 501, exclusive NOR gates 502, 503, . . . , 505, and 506, an AND gate 707, an RS flip-flop 508, an AND gate 509, an up counter 510, an OR gate 511, a NOR gate 512, an AND gate 513, an edge detection circuit 514, and RS flip-flops 515 and 516.

The subtracter 501 has a n number of bits of input terminals. An n-bit control signal SN is input to this from an external unit.

The n number of bits of output terminals of the subtracter 501 are respectively connected to one of the input terminals of the exclusive NOR gates 502, 503, . . . , 505, and 506. The other input terminals of the exclusive NOR gates 502, 503, . . . , 505, and 506 are connected to n number of bits of output terminals of the up counter 510.

The output terminals of the exclusive NOR gates 502, 503, . . . , 505, and 506 are connected to the input terminal of the AND gate 507, the output terminal of the AND gate 507 is connected to the set signal input terminal S of the RS flip-flop, the reset signal input terminal R of the RS flip-flop is connected to the output terminal of the AND gate 509, and the input terminal of the AND gate is connected to the output terminal of the RS flip-flop and the output terminal of the edge detection circuit 514, respectively.

The clock input terminal "in" of the up counter 510 is connected to the output terminal of the edge detection circuit 514, and the reset signal input terminal "reset" is connected to the output terminal of the OR gate 511. The input terminal of the OR gate 511 is respectively connected to the output terminal of the AND gate 509 and the reset signal input terminal rst.

One input terminal of the NOR gate 512 is connected to the clock input terminal ckin, and the other input terminal is connected to the inversion output terminal of the RS flip-flop 515. The output terminal of the NOR gate 512 is connected to the set signal input terminal S of the RS flip-flop 516, the output terminal of the RS flip-flop 516 is connected to one input terminal of the AND gate 513, and the other input terminal of the AND gate 513 is connected to the clock input terminal ckin. The output terminal of the AND gate 513 is connected to the input terminal of the edge detection circuit 514.

The reset signal input terminals R of the RS flip-flops 515 and 516 are connected to the reset signal input terminal rst.

The value obtained by subtracting one from the n number of bits of the control signal SN input to the subtracter 510 is output. Further, the count is carried out from the second pulse of the clock input to the clock input terminal ckin, the count is compared with the value of the n number of bits output from the subtracter 501, and when the result of comparison is coincidence, the mask signal $S_{mk}$ is output to the output terminal of the RS flip-flop 508. The up counter 510 is reset by the pulse of the mask signal $S_{mk}$, the RS flip-flop is reset, and the mask signal $S_{mk}$ is held at the low level.

FIGS. 15A to 15D are waveform diagrams of the operation of the programmable mask generation circuit 50 where a value "4" is set in the subtracter 501.

As illustrated, when the up counter 510 starts the count from the second pulse of the clock input to the clock input terminal ckin, and the third pulse is counted, the mask signal $S_{mk}$ is set to the high level, and the fourth pulse of the clock is output to the output terminal "out" of the programmable mask generation circuit 50 by this.

The signal output to the output terminal out of the programmable mask generation circuit 50 is input to the phase comparator 20 as the oscillation signal, and the phase comparison with the reference clock signal $CK_2$ is carried out by the phase comparator 20. Then, the up signal $S_{up}$ or the down signal $S_{dw}$ is generated in accordance with the result of comparison and output to the counter 30.

Figure 16:
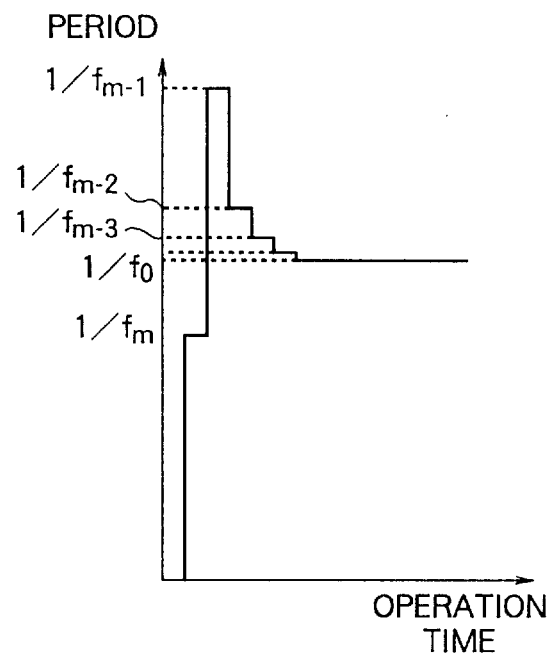
FIG. 16 is a waveform diagram of the operation at the time of start-up of the digital PLL circuit.
Figure 17:
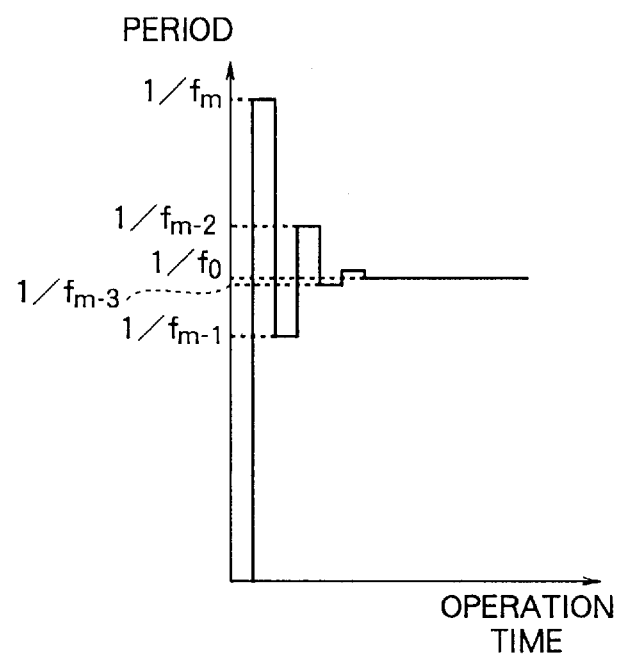
FIG. 17 is a waveform diagram of the operation at the time of start-up of the digital PLL circuit.

The digital PLL circuit shown in FIG. 4 is constituted by the above circuit. FIG. 16 and FIG. 17 are waveform diagrams of the operation at the time of start-up of the digital PLL circuit of the present example.

FIG. 16 and FIG. 17 show different situations at the time of start-up. Below, an explanation will be made of the start-up operation of the digital PLL circuit of the present example by referring to these figures.

As mentioned above, the value of each bit is determined from the most significant bit, that is, the m−1 bit toward the least significant bit, that is 0 bit, in the count of m bits based on the up signal $S_{up}$ and the down signal $S_{dw}$ from the phase comparator 20 until the digital PLL circuit reaches the locked state after the counter 30 starts operation. Then, after the digital PLL circuit reaches the locked state, the change of the reference clock signal $CK_2$ is tracked by the up/down counter 302 in accordance with the up signal $S_{up}$ and the down signal $S_{dw}$ from the phase comparator 20.

As shown in FIG. 16, first, the most significant bit, i.e., m−1 bit, of the counter 30 is set to "1", the frequency of the clock generated by the digital control delay line 40 in response to this is $f_{m-1}$, and the cycle is $1/f_{m-1}$. Here, the target frequency of the digital PLL circuit is the frequency $f_0$ of the reference clock signal $CK_2$ input to the phase comparator 20.

In the phase comparator 20, the phases of the reference clock signal $CK_2$ and the oscillation signal S50 from the programmable mask generation circuit 50 are compared, and it is necessary to raise the cycle in accordance with the result of comparison. The up signal $S_{up}$ is output from the phase comparator 20 to the counter 30. By this, in the counter 30, the m−2 bit is set to "1" while the m−1 bit is set to "1" as it is. The frequency of the output signal of the digital control delay line 40 at this time is $f_{mm-2}$, and the cycle is $1/f_{m-2}$.

In the phase comparator 20, the phases of the reference clock signal $CK_2$ and the oscillation signal S50 from the programmable mask generation circuit 50 are compared. It is necessary to reduce the cycle in accordance with the result of comparison, so the down signal $S_{dw}$ is output from the phase comparator 20 toward the counter 30. By this, in the counter 30, the m−2 bit is set to "0", and the m−3 bit is set to "1".

The above operation is repeatedly carried out up to the 0 bit of the counter 30. Finally, the frequency of the oscillation signal S50 from the programmable mask generation circuit 50 coincides with the frequency of the reference clock signal $CK_2$, and the digital PLL circuit becomes locked. In response to this, the lock signal $S_{end}$ is generated from the counter 30. After this, the change of the reference clock signal $CK_2$ is tracked in accordance with the up signal $S_{up}$ and the down signal $S_{dw}$ from the phase comparator 20 by the up/down counter 302 in the counter 30.

FIG. 17 is a waveform diagram of another example of the operation at the time of start-up of the digital PLL circuit. In the present example, the most significant bit, that is, the m−1 bit, of the counter 30 is set to "1", and the frequency of the oscillation signal S50 generated by the programmable mask generation circuit 50 becomes $1/f_{m-1}$. At this time, it is necessary to reduce the frequency as the result of phase comparison by the phase comparator 20, the m−1 bit of the counter 30 is set to "0" in accordance with this, and the m−2 bit is set to "1". In this state, the phases of the reference clock signal $CK_2$ and the oscillation signal S50 from the programmable mask generation circuit 50 are compared by the phase comparator 20, and the counter 30 determines the m−2 bit in accordance with the result of comparison. Thereafter, this operation is repeatedly carried out toward the bit 0 until the target frequency $f_0$ is reached. When the target frequency $f_0$ is reached, that is, when the digital PLL circuit reaches the locked state, the lock signal $S_{end}$ is generated by the counter 30. After this, the change of the reference clock signal $CK_2$ is followed in accordance with the up signal $S_{up}$ and the down signal $S_{dw}$ from the phase comparator 20 by the up/down counter 302 of the counter 30.

By the digital PLL circuit as described above, by setting the number m of bits of the counter 30 and the digital control delay line 40 large, the precision of the output frequency of the digital PLL circuit is improved. Accordingly, the shortening of the lock up time of the digital PLL circuit and the improvement of the precision of the output frequency, which have been mutually contradictory objectives in the past, are simultaneously and easily realized.

As explained above, according to the present embodiment, the clock control circuit 10 generates the clock signal $CK_2$ in response to the clock signal CLK, and the phase comparator 20 performs the phase comparison with the oscillation signal S50 from the programmable mask generation circuit 50 by using the clock signal $CK_2$ as the reference clock, generates the up signal $S_{up}$ or the down signal $S_{dw}$ in accordance with the result of comparison, and outputs the same to the counter 30. The counter 30 sequentially determines the values of the bits from the most significant bit toward the least significant bit in accordance with the control signal from the phase comparator 20, sets the m-bit count S30s, outputs the same to the digital control delay line 40, controls the frequency of the oscillation signal S40, generates the frequency multiplied signal S50 in accordance with the oscillation signal S40 by the programmable mask generation circuit 50, outputs the same to the phase comparator 20, and follows the change of the reference clock signal $CK_2$ in accordance with the control signal from the phase comparator 20 after reaching the locked state. Therefore, the mutually contradictory objectives such as the shortening of the lock up time and the improvement of the precision of the frequency can be simultaneously and easily achieved.

Second Embodiment

Figure 18:
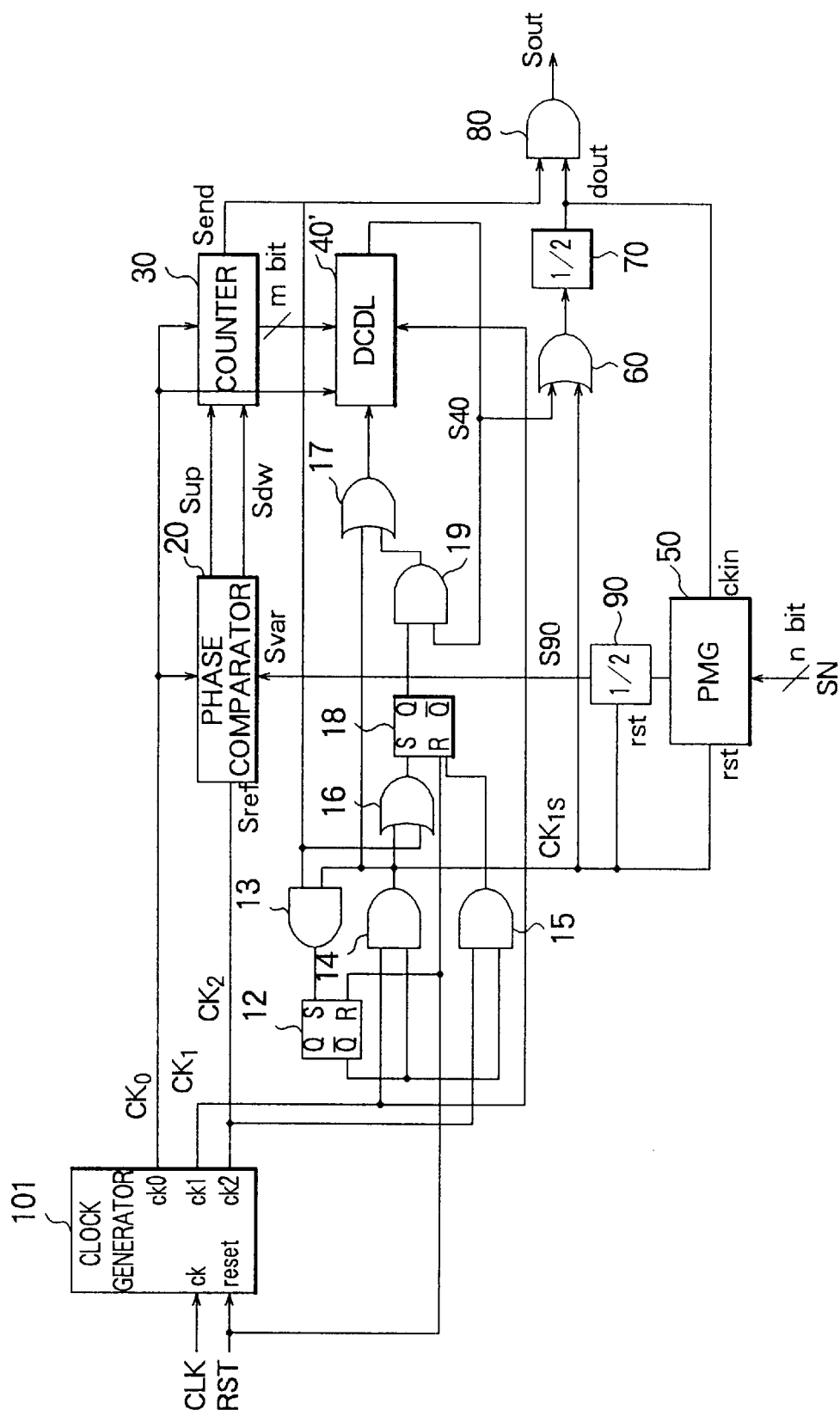
FIG. 18 is a circuit diagram of a second embodiment of the digital PLL circuit according to the present invention.
Figure 19:
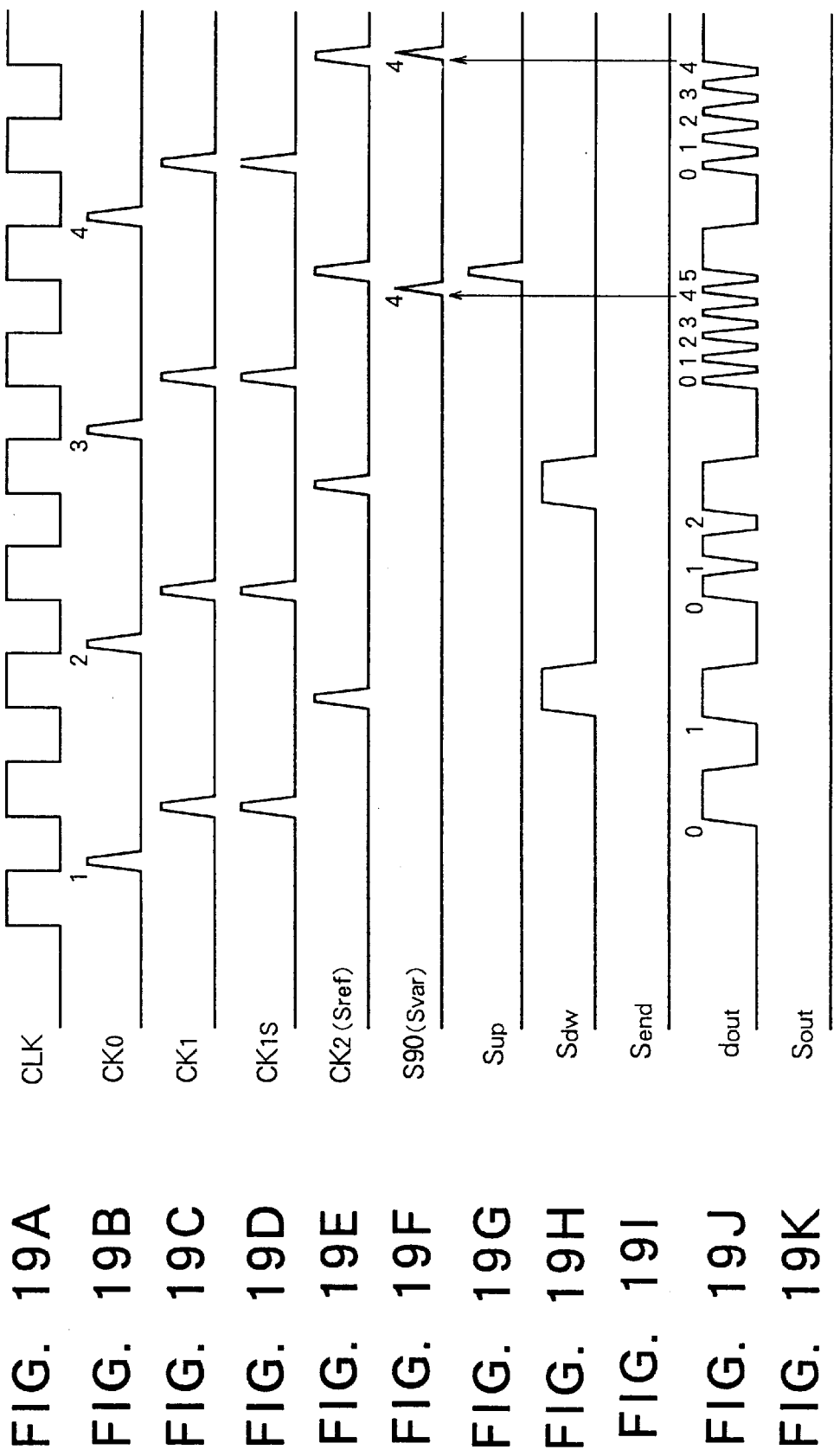
FIGS. 19A to 19K are waveform diagrams of the operation of the second embodiment.
Figure 20:
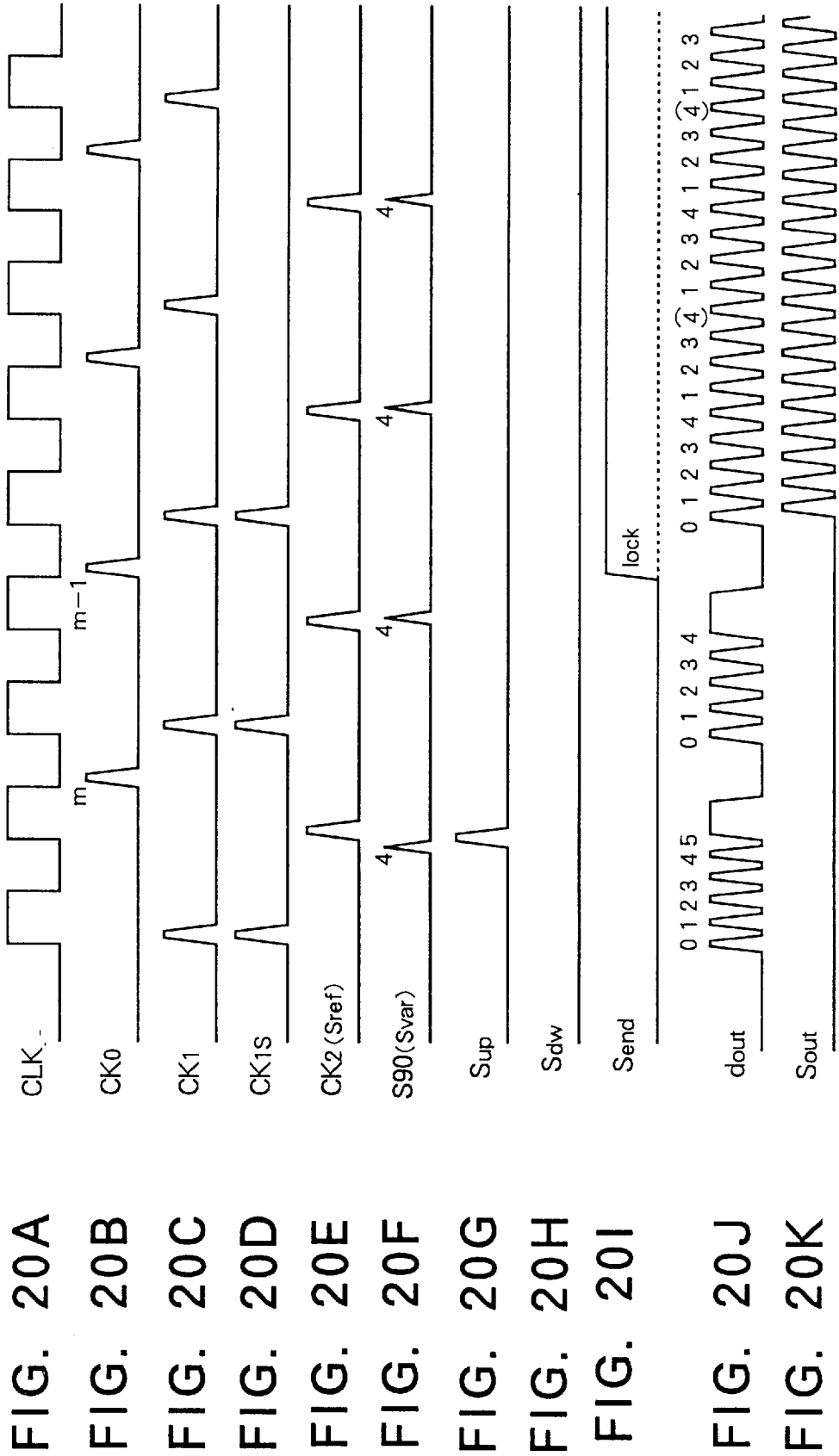
FIGS. 20A to 20K are waveform diagrams of the operation of the second embodiment.

FIG. 18 is a circuit diagram of the second embodiment of the digital PLL circuit according to the present invention.

As illustrated, the digital PLL circuit of the present example is constituted by the clock generator 101, phase comparator 20, counter 30, digital control delay line 40', programmable mask generation circuit 50, RS flip-flops 12 and 18, AND gates 13, 14, 15, 19, and 80, OR gates 17 and 60, and frequency dividers 70 and 90.

Note that, the digital control delay line 40' is constituted by either of the digital control delay line 40a or 40b shown in FIG. 12 or FIG. 13.

The clock input terminal ck of the clock generation circuit 101 is connected to the input terminal of the clock signal CLK, and the reset signal input terminal reset is connected to the input terminal of the reset signal RST. The output terminal of the clock signal $CK_0$ is connected to the phase comparator 20, the counter 30, and the digital control delay line 40', and the output terminal of the clock signal $CK_1$ is connected to the input terminal of the AND gate 14 and the digital control delay line 40'. The output terminal of the clock signal $CK_2$ is connected to the AND gate 15 and the phase comparator 20.

The output terminal of the up signal $S_{up}$ and the down signal $S_{dw}$ of the phase comparator 20 are connected to the counter 30, and the output terminal of the lock signal $S_{end}$ of the counter 30 is connected to the input terminals of the AND gate 13, OR gate 16, and the AND gate 80.

The output terminal of the digital control delay line 40' is connected to one input terminal of the AND gate 19, and the other input terminal of the AND gate 19 is connected to the output terminal of the RS flip-flop 18. The output terminal of the AND gate is connected to one input terminal of the OR gate 17, and the other input terminal of the OR gate 17 is connected to the output terminal of the AND gate 14. The output terminal of the OR gate 17 is connected to the clock input terminal "in" of the digital control delay line 40'.

The clock output terminal "out" of the digital control delay line 40' is connected to one input terminal of the OR gate 60, and the other input terminal is connected to the output terminal of the AND gate 14. The output terminal of the OR gate 60 is connected to the input terminal of the frequency divider 70, the output terminal of the frequency divider 70 is connected to the one input terminal of the AND gate 80, and the other input terminal is connected to the output terminal of the lock signal $S_{end}$ of the counter 30. The output terminal of the AND gate 80 is connected to the clock signal output terminal of the digital PLL circuit.

The output terminal of the frequency divider 70 is connected to the clock input terminal ckin of the programmable mask generation circuit 50, and the reset signal input terminal "reset" of the programmable mask generation circuit 50 is connected to the output terminal of the AND gate 14. The clock output terminal "out" of the programmable mask generation circuit 50 is connected to the input terminal of the frequency divider 90, and the reset signal input terminal of the frequency divider 90 is connected to the output terminal of the AND gate 14. Further, the clock output terminal of the frequency divider 90 is connected to the phase comparator 20.

The frequency divider 90 divides the frequency of the oscillation signal from the programmable mask generation circuit 50 by two and outputs the frequency-divided signal S90 to the phase comparator 20 as the comparison target signal $S_{var}$.

Further, the frequency divider 90 receives the clock signal $CK_{1S}$ and is reset by this signal.

FIGS. 19A to 19K and FIGS. 20A to 20K are waveform diagrams of the operation of the digital PLL circuit shown in FIG. 18. Below, an explanation will be made of the operation of the example of the present circuit by referring to FIG. 18, FIGS. 19A to 19K, and FIGS. 20A to 20K.

Note that, FIGS. 19A to 19K show the operation before the digital PLL circuit is locked, and FIGS. 20A to 20K show the operation after it is locked.

Here, the programmable mask generation circuit 50 is set as n=4 by the control signal SN, that is, performs ¼ frequency division with respect to the signal input to the clock input terminal ckin and outputs the frequency-divided signal to the frequency divider 90.

As shown in FIGS. 19A to 19K, after the reset signal RST is switched from the high level to the low level, the digital PLL circuit starts the operation. By the clock generation circuit 101, the pulse 1 of the clock signal $CK_0$ is generated at the falling edge of the clock signal CLK pulse 1, the pulse 1 of the clock signal $CK_1$ is generated at the rising edge of the pulse 2 of the clock signal CLK, and further the pulse 1 of the clock signal $CK_2$ is generated at the rising edge of the pulse 3 of the clock signal CLK.

Further, as shown in FIGS. 19A to 19K, until the digital PLL circuit reaches the locked state, the clock signal $CK_{1S}$ is generated by the circuit constituted by the AND gates 13 and 14 and the RS flip-flop 12 at a similar timing to that of the clock signal $CK_1$.

By the clock signal $CK_{1S}$, the programmable mask generation circuit 50 and the frequency divider 90 are reset.

Further, the clock signal $CK_{1S}$ is input to the set signal input terminal S of the RS flip-flop 18 via the OR gate 16. The RS flip-flop is set in accordance with this. For this reason, the output signal S40 of the digital control delay line 40' is fed back to the input side of the digital control delay line 40' via the AND gate 19 and the OR gate 17, and the oscillation signal S40 is generated.

On the other hand, the RS flip-flop 18 is reset by either of the reset signal RST or the reference clock signal $CK_2$. When the RS flip-flop 18 is reset, the output terminal of the AND gate 19 is held at the low level, and the oscillation operation of the digital control delay line 40' stops.

In this way, the operation starts from the initialization state of the RS flip-flop 18 and the digital control delay line 40' by the reset signal RST. The RS flip-flop 18 is set by the first clock signal $CK_{1S}$, and the feedback loop of the digital control delay line 40' is formed. Further, the clock signal $CK_{1S}$ is input to the input terminal of the digital control delay line 40' via the OR gate 17, and the digital control delay line 40' starts the oscillation operation by this.

Then, the RS flip-flop 18 is reset by the clock signal $CK_2$, and the oscillation operation of the digital control delay line 40' stops.

In this way, until the digital PLL circuit reaches the locked state, the oscillation signal S40 is generated in the digital control delay line 40' by an intermittent operation, and the oscillation signal S40 is output only during a term of from the clock signal $CK_{1S}$ to the clock signal $CK_2$.

The oscillation signal S40 is input to the frequency divider 70 via the OR gate 60, and the frequency-divided signal $d_{out}$ is generated and output to the programmable mask generation circuit 50. In the programmable mask generation circuit 50, the mask signal $S_{mk}$ is generated based on the value set by the control signal SN, the predetermined pulse is selected from the frequency-divided signal $d_{out}$, and this is output to the frequency divider 90.

The frequency divider 90 is reset by the clock signal $CK_{1S}$ and set to the initial state, therefore the pulse from the programmable mask generation circuit 50 is output to the phase comparator 20 as the comparison target signal $S_{var}$ as it is.

By the phase comparator 20, the phase comparison with the oscillation signal S90 from the frequency divider 90 is carried out by using the clock signal $CK_2$ from the clock generation circuit 101 as the reference clock. The up signal $S_{up}$ or the down signal $S_{dw}$ is generated in accordance with the result of comparison and output to the counter 30.

In the counter 30, the value is sequentially determined from the most significant bit to the least significant bit in accordance with the up signal $S_{up}$ and the down signal $S_{dw}$ from the phase comparator 20, and the m-bit count S30 is output to the digital control delay line 40'.

The delay time of the digital control delay line 40' is controlled in accordance with the count S30. Further, the output terminal "out" of the digital control delay line 40' is connected to the input terminal "in" via the AND gate 19 and the OR gate 17 and the loop is formed, therefore the frequency of the generated oscillation signal S40 is controlled in accordance with the delay time.

The oscillation signal S40 generated by the digital control delay line 40' is output to the frequency divider 70 via the OR gate 60, and the oscillation signal $d_{out}$ obtained by the ½ frequency division by the frequency divider 70 is output to the AND gate 80 and the programmable mask generation circuit 50.

The lock signal $S_{end}$ from the counter 30 is input to the other input terminal of the AND gate 80, and when the digital PLL circuit reaches the locked state, after the lock signal $S_{end}$ is switched from the low level to the high level, the oscillation signal $d_{out}$ is output to the output terminal of the AND gate 80.

The oscillation signal $d_{out}$ from the frequency divider 70 is output to the programmable mask generation circuit 50. In the programmable mask generation circuit 50, in accordance with the value set by the input control signal SN, the pulse is selected from the oscillation signal $d_{out}$ at a predetermined interval and output to the frequency divider 90.

For example, when the value n=4 is set by the control signal SN, the fourth clock is selected from the oscillation signal $d_{out}$ by the programmable mask generation circuit 50 as shown in FIGS. 19A to 19K and output to the frequency divider 90.

By the frequency divider 90, the clock from the programmable mask generation circuit 50 is divided in frequency by two and output to the phase comparator 20 as the oscillation signal $S_{var}$.

In the phase comparator 20, the phases of the reference clock signal $CK_2$ from the clock generation circuit 101 and the oscillation signal S90 from the frequency divider 90 are compared, and the up signal $S_{up}$ or the down signal $S_{dw}$ is generated in accordance with the result of comparison and the result output to the counter 30.

For example, where the result of the comparison is that the cycle of the oscillation signal S90 is long, the down signal $S_{dw}$ is output, while in the reverse case, the up signal $S_{up}$ is output.

The value of the m-bit count S30 is sequentially set from the most significant bit to the least significant bit by the counter 30 in accordance with the up signal $S_{up}$ and the down signal $S_{dw}$ from the phase comparator 20, and the frequency of the generated oscillation signal S40 is controlled by the digital control delay line 40' in accordance with this.

When the frequency of the oscillation signal S90 generated by the frequency divider 90 coincides with or is extremely close to the frequency of the reference clock signal $CK_2$, it is decided that the digital PLL circuit reaches the locked state, and the lock signal $S_{end}$ is generated by the counter 30. In response to this, the oscillation signal $d_{out}$ is output by the AND gate 80.

Note that, after the digital PLL circuit becomes the locked state, the frequency $f_0$ of the oscillation signal $d_{out}$ becomes the frequency of the value set by the control signal SN input to the programmable mask generation circuit 50 and obtained by frequency multiplication with respect to the clock signal CLK input to the clock generation circuit 101. In the case of the present example, in the programmable mask generation circuit 50, the value 4 is set by the control signal SN, therefore the frequency $f_0$ of the oscillation signal $d_{out}$ generated by the digital PLL circuit becomes four times the frequency $f_{in}$ of the clock signal CLK.

After the digital PLL circuit becomes the locked state, the lock signal $S_{end}$ from the counter 30 is switched to the high level. In response to this, the pulse of the clock signal $CK_{1S}$ is output only one time and then held at the low level. Further, the output terminal of the AND gate 15 is held at the low level, and the output terminal is held at the high level without the reset of the RS flip-flop 18 except the level change of the reset signal RST. For this reason, the feedback loop of the digital control delay line 40' is held, and the continuous oscillation is carried out by the digital control delay line 40'.

Further, the clock signal $CK_{1S}$ is held at the low level, so the frequency divider 90 performs the usual ½ frequency division operation without being reset, therefore the oscillation signal S90 is generated at a rate of once per two times with respect to the oscillation pulse from the programmable mask generation circuit 50 and output to the phase comparator 20 as the comparison target signal $S_{var}$.

Further, the lock signal $S_{end}$ is held at the high level, therefore the oscillation signal $d_{out}$ from the frequency divider 70 is output as the signal $S_{out}$ via the AND gate 80.

In the present embodiment, after the digital PLL circuit reaches the looked state, the output signal of the programmable mask generation circuit 50 is frequency-divided by the frequency divider 90, and the phase comparison operation in the phase comparator 20 is carried out once per two times with respect to the external clock signal CLK.

Third Embodiment

Figure 21:
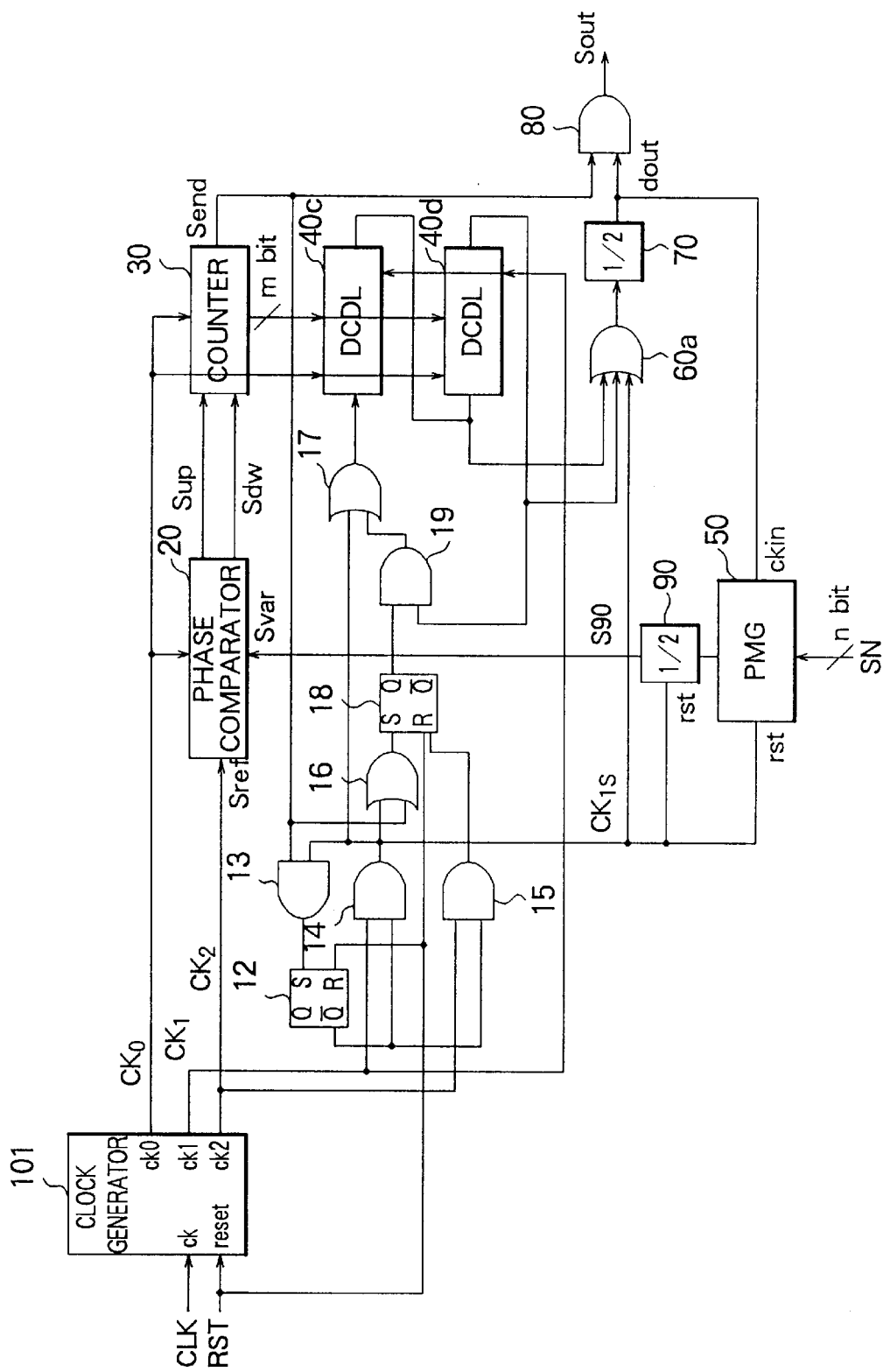
FIG. 21 is a circuit diagram of a third embodiment of the digital PLL circuit according to the present invention.

FIG. 21 is a circuit diagram of a third embodiment of the digital PLL circuit according to the present invention.

As illustrated, in the digital PLL circuit of the present embodiment, two delay circuits of the digital control delay lines 40c and 40d are provided, and the OR gate 60a is constituted by a 3-input OR gate.

The output terminal out of the digital control delay line 40c is connected to the input terminal of the digital control delay line 40d and one input terminal of the OR gate 60a, and the output terminal out of the digital control delay line 40d is connected to one input terminal of the AND gate 19.

The other parts of the digital PLL circuit in the present embodiment are similar to those of the second embodiment of the digital PLL circuit shown in FIG. 18. Below, an explanation will be made of only the different parts.

In the present example, each delay circuit operates at the frequency $f_0$ by providing two digital control delay lines 40c and 40d. Note that, here, $f_0$ is the output signal of the frequency divider 70, that is, the frequency of the oscillation signal $d_{out}$.

In contrast to the fact that the operating frequency of the digital control delay line 40 is $2f_0$, in the second embodiment shown in FIG. 18, the operating frequency of the digital control delay lines 40c and 40d in the present example becomes about a half, therefore the operation of the internal circuit with respect to a higher output frequency becomes possible.

Fourth Embodiment

Figure 22:
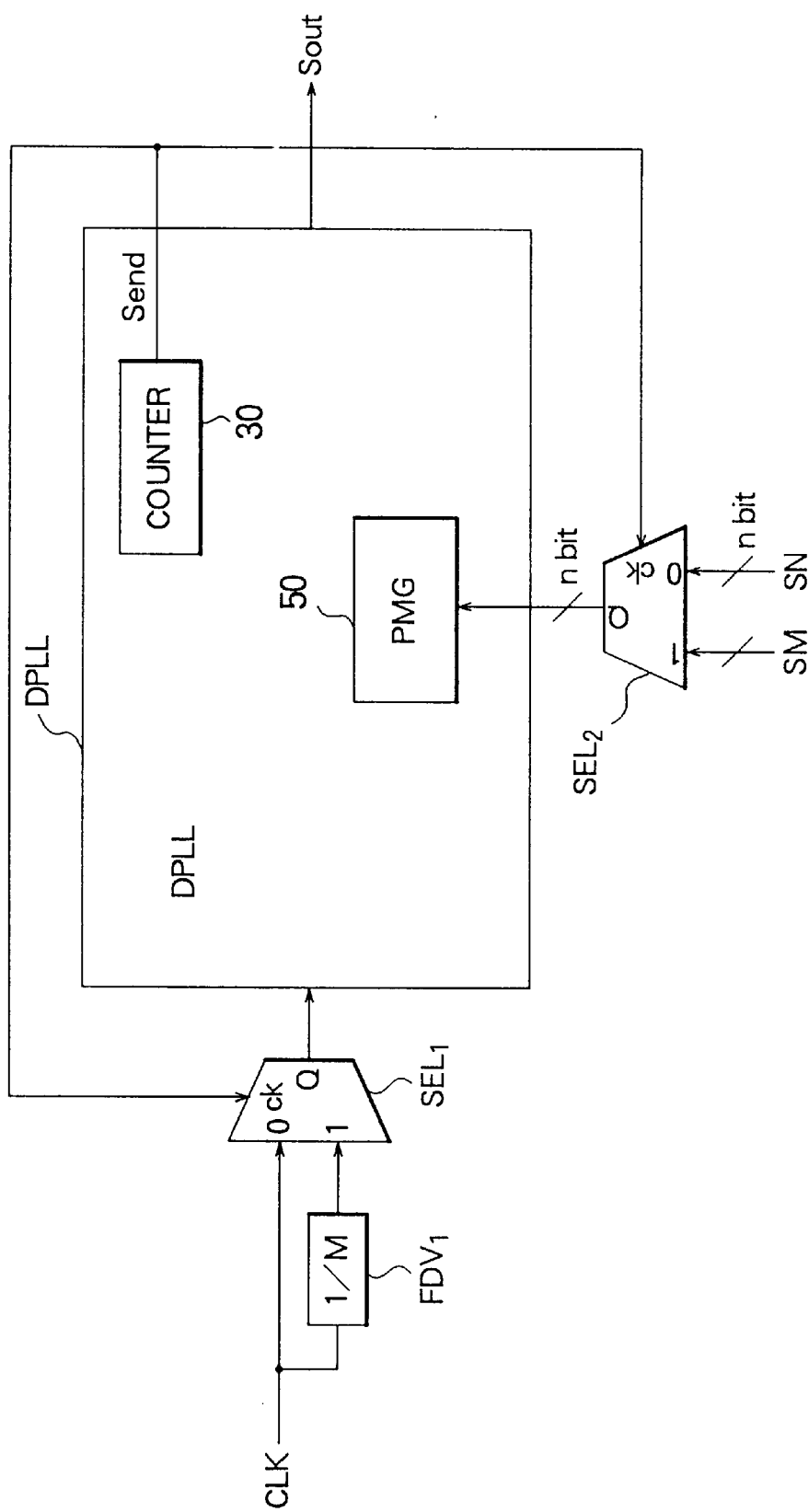
FIG. 22 is a circuit diagram of a fourth embodiment of the digital PLL circuit according to the present invention.

FIG. 22 is a circuit diagram of the fourth embodiment of the digital PLL circuit according to the present invention.

In FIG. 22, the digital PLL circuit DPLL is similar to the first embodiment shown in FIG. 4. The clock signal CLK input from an external unit and the signal obtained by dividing the frequency thereof by M are selected by a selector $SEL_1$ and output to the clock input terminal of the digital PLL circuit DPLL.

The selector $SEL_1$ is controlled by the lock signal $S_{end}$ from the counter 30. When the lock signal $S_{end}$ is at the low level, the clock signal CLK is selected and output to the digital PLL circuit DPLL, and when the lock signal $S_{end}$ is at the high level, the frequency-divided signal of the clock signal CLK obtained by dividing the frequency thereof by M by the frequency divider $FDV_1$ is selected and output to the digital PLL circuit DPLL.

The programmable mask generation circuit 50 is controlled in its operation by the n-bit control signal from the selector $SEL_2$. The control signal SM is input to one input of the selector $SEL_2$, and the control signal SN is input to another input. An n-bit value N×M is set by the control signal SM, and an n-bit value N is set by the control signal SN.

The selector $SEL_2$ is controlled by the lock signal $S_{end}$ from the counter 30 similar to the selector $SEL_1$. When the lock signal $S_{end}$ is at the low level, the control signal SN is selected and the value N is input to the programmable mask generation circuit 50, and when the lock signal $S_{end}$ is at the high level, the control signal SM is selected and the value N×M is input to the programmable mask generation circuit 50.

Until the digital PLL circuit DPLL reaches the locked state, the lock signal $S_{end}$ of a low level is output by the counter 30. The clock signal CLK is selected by the selector $SEL_1$ in response to this and input to the digital PLL circuit DPLL. Further, the control signal SN is selected by the selector $SEL_2$, and the value N is set in the programmable mask generation circuit 50.

In this case, in the digital PLL circuit DPLL, the value is sequentially set from the most significant bit to the least significant bit in the counter 30 by using the frequency $f_{in}$ of the clock signal CLK as the input frequency. When it reaches the locked state, the frequency of the signal $S_{out}$ output by the digital PLL circuit DPLL becomes $f_{in} \times N$.

When the digital PLL circuit DPLL reaches the locked state, the lock signal $S_{end}$ is switched from the low level to the high level by the counter 30. The frequency-divided signal obtained by dividing the frequency of the clock signal CLK by M is selected at the selector $SEL_1$ in response to this and input to the digital PLL circuit DPLL. Further, the control signal SM is selected in the selector $SEL_2$, and the value M×N is set in the programmable mask generation circuit 50.

In this way, after the digital PLL circuit DPLL reaches the locked state, the signal divided in frequency by M of the clock signal CLK is input to the digital PLL circuit DPLL in accordance with the level of the lock signal $S_{end}$, and the comparison operation in the phase comparator 20 is carried out one time in 2×M cycles of the clock signal CLK. By reducing the comparison operation, the reduction of the consumed power of the digital PLL circuit DPLL can be achieved.

Fifth Embodiment

Figure 23:
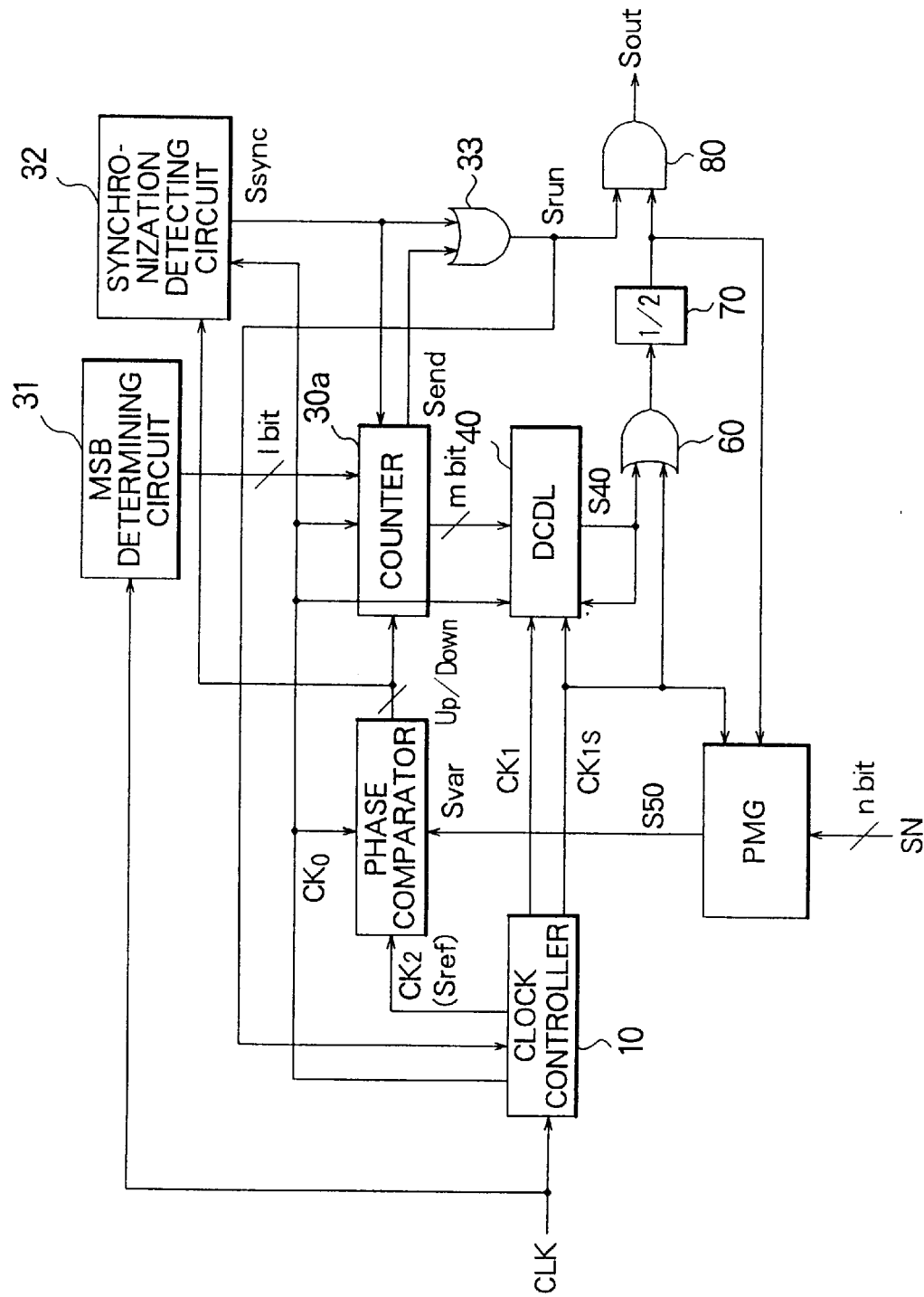
FIG. 23 is a circuit diagram of a fifth embodiment of the digital PLL circuit according to the present invention.

FIG. 23 is a circuit diagram of a fifth embodiment of the digital PLL circuit according to the present invention.

In FIG. 23, in the digital PLL circuit, a most significant bit determination counter 30 and a synchronization decision circuit 32 are newly provided in comparison with the first embodiment shown in FIG. 4.

The most significant bit determination counter 31 sets the optimum most significant bit in advance before the digital PLL circuit starts operation. After the start of operation, the most significant bit of the counter 30a is determined by the signal S31 from the most significant bit determination counter 31, and the value is sequentially determined from the most significant bit toward the least significant bit, therefore the lock up time of the digital PLL circuit can be shortened.

For example, the most significant bit determination counter 31 is provided with an oscillator generating a signal having a higher frequency than that of the clock signal CLK input from an external unit as a built-in or external device. The most significant bit determination counter 31 performs the counting by the cycle up counter of the reference clock signal by using the oscillation signal from this oscillator as a standard and determines the optimum most significant bit by the selector from the relationship of the count and the frequency of the output signal of the digital control delay line 40.

The synchronization decision circuit 32 receives the up signal $S_{up}$ and the down signal $S_{dw}$ from the phase comparator 20 and the clock signal $CK_0$ from the clock control circuit 10 and decides on the synchronization state of the digital PLL circuit. For example, when neither of the up signal $S_{up}$ nor down signal $S_{dw}$ are generated by the phase comparator 20, it is decided that the digital PLL circuit is in the synchronization state, that is, in the locked state, and a synchronization signal $S_{sync}$ is generated and output to the counter 30 and the OR gate 33.

The counter 30 sequentially sets the remaining bits from the most significant bit to the least significant bit determined by the most significant bit determination counter 31. When receiving the synchronization signal $S_{sync}$ from the synchronization decision circuit 32 in the middle of this operation, it is decided that the digital PLL circuit reaches the locked state, the lock signal $S_{end}$ is generated, and the setting of the bits after this is stopped. By this, the lock up time can be further shortened.

When receiving either of the lock signal $S_{end}$ from the counter 30 or the synchronization signal $S_{sync}$ from the synchronization decision circuit 32 by the OR gate 33, the control signal $S_{run}$ is output to the AND gate 80, and the frequency-divided signal from the frequency divider 70 is output as the output signal $S_{out}$ in response to this.

FIGS. 24A to 24N are waveform diagrams of the operation of the digital PLL circuit of the present example. Below, an explanation will be made of the operation of the digital PLL circuit of the present example while referring to these waveform diagrams.

As illustrated, after the reset signal RST is switched to the low level, the digital PLL circuit starts the operation. First, in response to the control signal "setbit", the most significant bit of the counter 30 is determined by the most significant bit determination counter 31. Here, for example the m−1 bit is determined as the most significant bit.

The operation after the most significant bit is determined is similar to that of the first embodiment. The value is sequentially set from the determined most significant bit to the least significant bit. Then, in the middle of the setting of the bit, for example, in the pulse m of the clock signal $CK_0$ shown in FIG. 24, it is decided that the digital PLL circuit has reached the locked state by the synchronization decision circuit 32, and the synchronization signal $S_{sync}$ is output. In response to this, the control signal $S_{run}$ output by the OR gate 33 is switched from the low level to the high level, and at the counter 30, the bit set operation stops, the count S30 is set by the up/down counter in accordance with the up signal $S_{up}$ and the down signal $S_{dw}$ from the phase comparator 20, and the change of the clock signal CLK is tracked. Namely, the operation of the counter 30 is switched to the state after the locking.

According to the present embodiment, by newly providing the most significant bit determination counter 31 and the synchronization decision circuit 32 in the digital PLL circuit, the most significant bit is loaded on the counter 30 after the start of the operation of the digital PLL circuit, and the count is sequentially set toward the least significant bit. When the locked state is reached in the middle, the synchronization signal $S_{sync}$ is output by the synchronization decision circuit 32, the bit set operation of the counter 30 is stopped, and the change of the clock signal CLK is tracked by the up/down counter in accordance with the up signal $S_{up}$ and the down signal $S_{dw}$ from the phase comparator 20 after this, therefore the digital PLL circuit can shorten the lock up time.

While the invention has been described by reference to specific embodiments chosen for purposes of illustration, it should be apparent that numerous modifications could be made thereto by those skilled in the art without departing from the basic concept and scope of the invention.

What is claimed is:

1. A digital PLL circuit comprising:
   a clock generation circuit for generating first, second, and third clock signals based on a reference clock signal;
   a phase comparison circuit for comparing phases of said third clock signal and a signal to be compared;
   a digital counter for sequentially determining a count from a most significant bit to a least significant bit based on the result of comparison of said phase comparison circuit for every input of said first clock signal; and
   a frequency multiplying circuit which gives a delay in accordance with the count from said digital counter with respect to said second clock signal, multiplies the frequency of the second clock signal by a predetermined frequency factor, and outputs the frequency multiplied signal to said phase comparison circuit as said signal to be compared.

2. A digital PLL circuit according to claim 1, wherein:
   said digital counter generates a lock signal indicating that the digital PLL circuit becomes a locked state after determining all bits and
   said clock generation circuit generates a suppressing signal for suppressing the delay operation of said frequency multiplying circuit based on said second lock signal when said lock signal is input and outputs the suppressing signal to said frequency multiplying circuit.

3. A digital PLL circuit according to claim 2, wherein said frequency multiplying circuit comprises:
   an intermittent operation control circuit which stops the signal output in accordance with said first clock signal and restarts the signal output in response to said second clock signal and
   an operation switching circuit for switching a mode from said intermittent operation to a continuous output operation in response to said lock signal.

4. A digital PLL circuit according to claim 2, wherein said frequency multiplying circuit comprises an output circuit which outputs said frequency multiplied signal to an external unit only during a term where said lock signal is input.

5. A digital PLL circuit according to claim 1, wherein:
   said digital counter comprises an operation switching means for switching a mode to the operation of sequentially determining the count from the least significant bit to the most significant bit based on the result of comparison of said phase comparison circuit after all bits are determined.

6. A digital PLL circuit according to claim 1, wherein said digital counter comprises:
   a register which sequentially determines an output data from the most significant bit to the least significant bit based on the result of comparison of said phase comparison circuit for every input of said first clock signal, determines all bits, and then outputs said lock signal;
   an up/down counter which sequentially determines the count from the least significant bit to the most significant bit based on the result of comparison of said phase comparison circuit after loading the output data of said register; and
   a selection circuit which selects the output data of said register until said lock signal is input and, when said lock signal is input, selects the count of said up/down counter and outputs the same to said frequency multiplying circuit.

7. A digital PLL circuit according to claim 2, wherein said suppressing signal generated by said clock generation circuit is generated in synchronization with said second clock signal and output as one pulse of the suppressing signal after said lock signal is input.

8. A digital PLL circuit according to claim 1, wherein said phase comparison circuit comprises:
   a phase comparator which outputs a phase difference signal with which a pulse width is set based on the phase difference of said third clock signal and the signal to be compared and
   a shaping circuit which shapes the pulse width of said phase difference signal and outputs the shaped signal to said digital counter.

9. A digital PLL circuit according to claim 8, wherein said shaping circuit shapes the pulse width of said phase difference signal to a width of not less than the pulse width of the lowest limit with which said digital counter can be driven.

10. A digital PLL circuit according to claim 8, wherein said shaping circuit comprises:
   a delay circuit which outputs a delayed signal obtained by delaying said phase difference signal by a predetermined time and
   a flip-flop circuit which sets the output signal level to a first level different from a reference level by said phase difference signal and resets the output signal level to the reference level by said delay signal.

11. A digital PLL circuit according to claim 1, wherein said frequency multiplying circuit comprises a delay circuit for controlling a delay time in response to the count from said digital counter.

12. A digital PLL circuit according to claim 11, wherein said delay circuit comprises a digital control delay circuit for controlling the delay time in response to an m-bit (m is a positive integer) count, said digital control delay circuit comprising m number of series-connected delay stages producing the delay time of $2^i t_d$ in response to the i-th bit ($0 \leq 1 < m$) of said count, where $t_d$ is a unit delay time.

13. A digital PLL circuit according to claim 12, wherein said delay circuit comprises:
   a data holding circuit for holding said count and
   an output circuit for outputting the i-th bit data of said data holding circuit to the i-th delay stage.

14. A digital PLL circuit according to claim 13, wherein the i-th delay stage in said delay circuit comprises:
   a buffer circuit for producing the delay time of $2^i t_d$ and
   a selection circuit which connects a first input terminal to the signal input terminal, connects a second input terminal to said signal input terminal via said buffer circuit, selects the signal of the first or second input terminal in accordance with the value of the i-th bit of said count, and outputs the same to the output terminal.

15. A digital PLL circuit according to claim 13, wherein the i-th delay stage in said delay circuit comprises:
   a buffer circuit which produces the delay of $(2^i-1)t_d$;
   a logical circuit with one input terminal which is connected to the signal input terminal, with another input terminal which is connected to the i-th bit data output terminal of said data holding circuit, and with an output terminal which is connected to the input terminal of said buffer circuit and produces the delay of $t_d$; and
   a selection circuit with a first input terminal which is connected to said signal input terminal and with a second input terminal which is connected to the output terminal of said buffer circuit which selects the signal of the first or second input terminal in accordance with the value of the i-th bit of said count and outputs the same to the output terminal.

16. A digital PLL circuit according to claim 11, wherein:
   said frequency multiplying circuit comprises at least two stages of said delay circuit connected in series and
   said frequency multiplied signal is generated by a logical operation of the output signal of the delay circuit of said each stage.

17. A digital PLL circuit according to claim 1, which comprises
   a frequency dividing circuit which divides the frequency of the frequency multiplied signal from said frequency multiplying circuit with a predetermined frequency division ratio and outputs a frequency-divided signal as said signal to be compared to said phase comparison circuit.

18. A digital PLL circuit according to claim 17, wherein said frequency dividing circuit comprises:
   a counter which is reset for every said suppressing signal and counts the frequency multiplied signal from said frequency multiplying circuit and
   an output circuit which outputs said frequency multiplied signal to said phase comparison circuit when the count of said counter coincides with said frequency division ratio.

19. A digital PLL circuit comprising:
   a second frequency dividing circuit for dividing the frequency of a reference clock signal by M (M is any integer);
   a first selection circuit which selects one of said reference clock signal and frequency-divided clock signal and outputs the selected signal;
   a phase comparison circuit which compares the phrases of the output signal of said first selection circuit and a signal to be compared;
   a digital counter which sequentially determines the count from the most significant bit to the least significant bit based on the result of comparison of said phase comparison circuit;
   a frequency multiplying circuit which outputs a frequency multiplied signal obtained by multiplication with a predetermined frequency factor in response to the count from said digital counter;
   a first frequency dividing circuit which divides the frequency of the frequency multiplied signal from said frequency multiplying circuit by N (N is any integer) and outputs the frequency-divided signal as said signal to be compared to said phase comparison circuit.

20. A digital PLL circuit according to claim 19, wherein:
   said digital counter generates a lock signal indicting that the digital PLL circuit becomes a locked state after determining all bits and
   said first selection circuit selects said reference clock signal until said lock signal is received, outputs the reference clock signal to said phrase comparison circuit, selects the frequency-divided signal divided in frequency by M after receiving said lock signal, and outputs the frequency divided signal to said phase comparison circuit.

21. A digital PLL circuit according to claim 19, wherein said digital counter comprises a switching circuit which generates the lock signal indicating that the digital PLL circuit becomes a locked state after determining all bits and switches a frequency division ratio of said first frequency dividing circuit from N to N×M by receiving said lock signal.

22. A digital PLL circuit comprising:

a phase comparison circuit which compares phases of a reference clock signal and a signal to be compared;

a digital counter which sequentially determines a count from the most significant bit toward the least significant bit based on the result of comparison of said phase comparison circuit;

a frequency multiplying circuit which outputs a frequency multiplied signal obtained by multiplication a the predetermined frequency factor to said phase comparison circuit as said signal to be compared in accordance with the count from said digital counter; and a synchronization decision circuit which decides on a synchronization state of the digital PLL circuit base on the result of comparison of said phase comparison circuit and outputs the result of decision to said digital counter.

23. A digital PLL circuit according to claim 21, wherein said digital counter comprises an operation switching circuit which switches an operation mode to the count operation of sequentially determining the count from the least significant bit to the most significant bit based on the result of comparison of said phase comparison circuit when receiving a result of decision indicating the synchronization state from said synchronization decision circuit.

* * * * *

UNITED STATES PATENT AND TRADEMARK OFFICE
CERTIFICATE OF CORRECTION

PATENT NO.   : 5,945,856
DATED        : August 31, 1999
INVENTOR(S)  : Hiroshi YANAGIUCHI It is certified that error appears in the above-identified patent and that said Letters Patent is hereby corrected as shown below:

Claim 22, line 9, Column 25, line 17, "multiplication a the pre-"

should read -- multiplication with a pre- --.

Signed and Sealed this

Second Day of May, 2000

Attest:

Q. TODD DICKINSON

Attesting Officer

Director of Patents and Trademarks